(12) United States Patent
Sung et al.

(10) Patent No.: US 8,149,038 B1
(45) Date of Patent: Apr. 3, 2012

(54) TECHNIQUES FOR PHASE ADJUSTMENT

(75) Inventors: Chiakang Sung, Milpitas, CA (US);
John Henry Bui, Sunnyvale, CA (US);
Khai Nguyen, San Jose, CA (US);
Bonnie I. Wang, Cupertino, CA (US);
Xiaobao Wang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/729,114

(22) Filed: Mar. 22, 2010

(51) Int. Cl.
*H03H 11/16* (2006.01)
(52) U.S. Cl. ......... 327/231; 327/235; 327/158; 327/161
(58) Field of Classification Search ................ 327/7, 12, 327/41–42, 156, 158–161
See application file for complete search history.

(56) References Cited

U.S. PATENT DOCUMENTS

| | | | |
|---|---|---|---|
| 5,592,370 A | 1/1997 | Rogers | |
| 6,177,812 B1 * | 1/2001 | Nagao et al. | 327/7 |
| 6,292,016 B1 | 9/2001 | Jefferson et al. | |
| 6,333,959 B1 | 12/2001 | Lai et al. | |
| 6,388,480 B1 | 5/2002 | Stubbs et al. | |
| 6,414,540 B2 * | 7/2002 | Drexler | 327/552 |
| 6,943,602 B1 * | 9/2005 | Lee | 327/158 |
| 7,570,542 B2 * | 8/2009 | Lee | 365/233.1 |

* cited by examiner

*Primary Examiner* — An Luu
(74) *Attorney, Agent, or Firm* — Steven J. Cahill

(57) ABSTRACT

A dynamic phase alignment circuit includes a phase generator circuit having delay-locked loop circuits that generate periodic output signals. Each of the delay-locked loop circuits generates one of the periodic output signals in response to at least two periodic input signals. A multiplexer circuit selects a selected periodic signal from among the periodic input signals and the periodic output signals based on select signals. A phase detection circuit compares a phase of the selected periodic signal to a data signal to generate a phase detection signal. A control logic circuit generates the select signals. The control logic circuit adjusts the select signals based on changes in the phase detection signal to cause the multiplexer circuit to adjust the phase of the selected periodic signal.

33 Claims, 16 Drawing Sheets

US 8,149,038 B1

TECHNIQUES FOR PHASE ADJUSTMENT

BACKGROUND

The present invention relates to electronic circuits, and more particularly, to techniques for adjusting a phase of a signal.

FIG. 1 illustrates an example of a prior art dynamic phase alignment (DPA) circuit 100. DPA circuit 100 includes clock selection multiplexer circuit 101A, clock buffer circuit 101B, phase detector circuits 102A, counter circuits 102B, and DPA control logic circuit 103.

Circuit 100 receives 8 periodic clock signals PH[7:0] from a phase-locked loop (PLL) circuit. The 8 clock signals PH[7:0] have relative phase offsets of 0°, 45°, 90°, 135°, 180°, 225°, 270°, and 315°. DPA circuit 100 also receives a data signal. DPA circuit 100 selects one of the 8 clock signals PH[7:0] that is nearest to the center of the data sampling window of the data signal. The selected clock signal is used to sample the data signal.

Clock selection multiplexer circuit 101A selects one of the clock signals PH[7:0] as the selected clock signal SCS. Clock buffer circuit 101B buffers the selected clock signal SCS to generate a buffered clock signal. The buffered clock signal is transmitted to inputs of phase detectors 102A. Phase detectors 102A compare the phase of the buffered clock signal to the data signal to generate UP and DOWN output signals. The phase detectors 102A cause the UP signal to be in a logic high state if the data signal toggles while the buffered clock signal is in a logic low state. The phase detectors 102A cause the DOWN signal to be in a logic high state if the data signal toggles while the buffered clock signal is in a logic high state. Counter circuits 102B count up if the UP signal is pulsing high. Counter circuits 102B count down if the DOWN signal is pulsing high.

DPA control logic circuit 103 generates select signals based on the output signals of counter circuits 102B. The select signals are transmitted to select inputs of clock selection multiplexer circuit 101A. DPA control logic 103 adjusts the select signals to cause clock selection multiplexer 101A to change the phase of the selected clock signal SCS based on changes in the output signals of counter circuits 102B.

BRIEF SUMMARY

According to some embodiments, a dynamic phase alignment circuit includes a phase generator circuit having delay-locked loop circuits that generate periodic output signals. Each of the delay-locked loop circuits generates one of the periodic output signals in response to at least two periodic input signals. A multiplexer circuit selects a selected periodic signal from among the periodic input signals and the periodic output signals based on select signals. A phase detection circuit compares a phase of the selected periodic signal to a data signal to generate a phase detection signal. A control logic circuit generates the select signals. The control logic circuit adjusts the select signals based on changes in the phase detection signal to cause the multiplexer circuit to adjust the phase of the selected periodic signal.

According to other embodiments, a phase comparator circuit generates a phase comparison signal in response to a delayed signal and a first periodic input signal. A shift register includes storage circuits coupled in series that generate delay control signals. Each of the storage circuits receives the phase comparison signal at a clock input. A delay chain includes adjustable delay circuits. Delays of the adjustable delay circuits vary based on changes in the delay control signals. The delay chain delays a second periodic input signal to generate the delayed signal.

Various objects, features, and advantages of the present invention will become apparent upon consideration of the following detailed description and the accompanying drawings.

DETAILED DESCRIPTION

Figure 1:
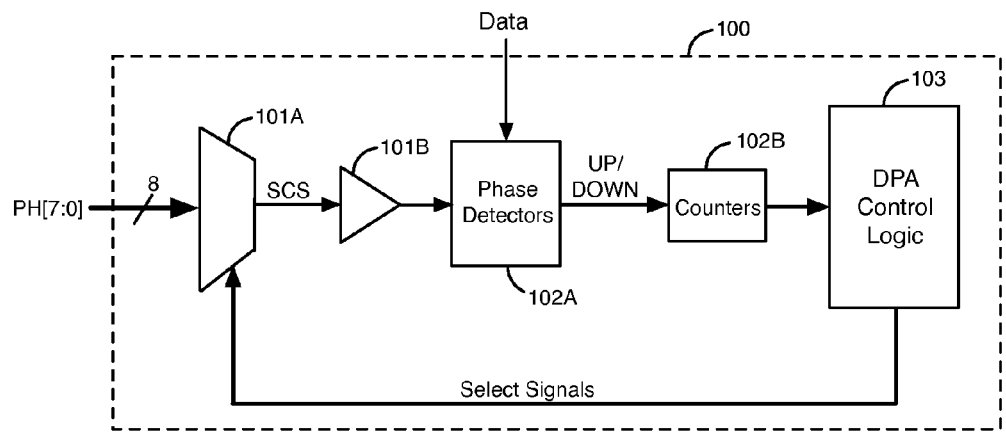
FIG. 1 illustrates an example of a prior art dynamic phase alignment (DPA) circuit.
Figure 2A:
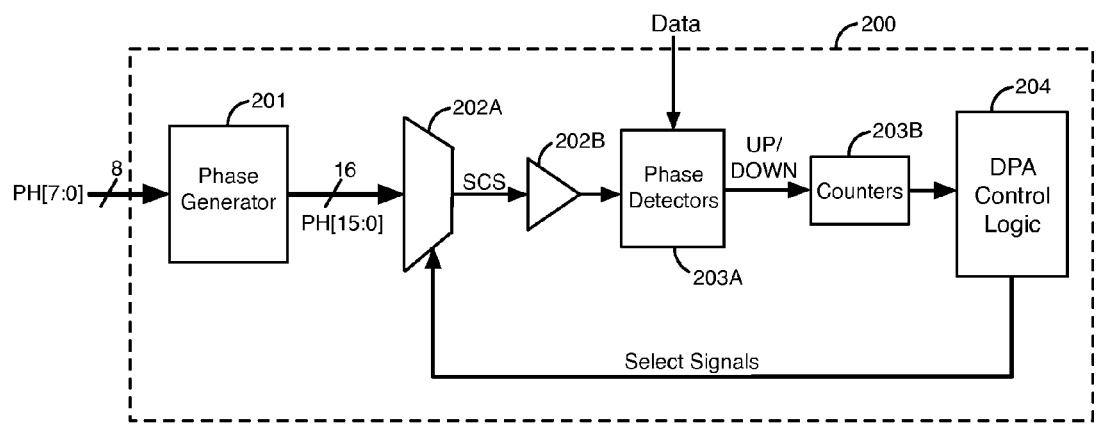
FIG. 2A illustrates an example of a dynamic phase alignment (DPA) circuit, according to an embodiment of the present invention.

FIG. 2A illustrates an example of a dynamic phase alignment (DPA) circuit 200, according to an embodiment of the present invention. DPA circuit 200 includes a phase generator circuit 201, clock selection multiplexer circuit 202A, clock buffer circuit 202B, phase detector circuits 203A, counter circuits 203B, and DPA control logic circuit 204. DPA circuit 200 is typically fabricated in an integrated circuit.

Eight periodic clock signals PH[7:0] are transmitted from a phase-locked loop or delay-locked loop circuit to phase generator 201. Clock signals PH[7:0] are also referred to as clock signals PH0, PH2, PH4, PH6, PH8, PH10, PH12, and PH14. Clock signals PH0, PH2, PH4, PH6, PH8, PH10, PH12, and PH14 have relative phase offsets of 0°, 45°, 90°, 135°, 180°, 225°, 270°, and 315°, respectively.

Phase generator 201 generates 8 additional periodic clock signals in response to the 8 input clock signals PH[7:0]. The 16 total clock signals output by phase generator 201 are referred to as clock signals PH[15:0]. Clock signals PH[15:0] are also referred to as clock signals PH0, PH1, PH2, PH3, PH4, PH5, PH6, PH7, PH8, PH9, PH10, PH11, PH12, PH13, PH14, and PH15. The output clock signals PH0, PH1, PH2, PH3, PH4, PH5, PH6, PH7, PH8, PH9, PH10, PH11, PH12, PH13, PH14, and PH15 (i.e., PH[15:0]) of phase generator 201 have relative phases of 0°, 22.5°, 45°, 67.5°, 90°, 112.5°, 135°, 157.5°, 180°, 202.5°, 225°, 247.5°, 270°, 292.5°, 315°, and 337.5° respectively. DPA circuit 200 provides 16 clock signals having 16 different phases between 0 degrees and 360 degrees to multiplexer 202A.

DPA circuit 200 also receives a data signal. Clock selection multiplexer 202A selects one of the 16 clock signals PH[15:0] that is nearest to the center of the data sampling window of the data signal. The selected clock signal SCS is used to sample the data signal. In many instances, DPA circuit 200 is able to select a clock signal having a phase offset that is closer to the center of the data sampling window than DPA circuit 100, because DPA circuit 200 uses 16 clock signals having 16 phases rather than just 8 clock signals.

The 16 output clock signals PH[15:0] of phase generator 201 are transmitted to clock selection multiplexer circuit 202A. Clock selection multiplexer 202A selects one of the 16 clock signals PH[15:0] as a selected clock signal SCS. Clock buffer circuit 202B buffers the selected clock signal SCS to generate a buffered clock signal. The buffered clock signal is transmitted to inputs of phase detector circuits 203A.

Phase detectors 203A compare the phase of the buffered clock signal to the data signal to generate UP and DOWN output signals. Phase detectors 203A cause the UP signal to be in a logic high state if the data signal toggles while the buffered clock signal is in a logic low state. Phase detectors 203A cause the DOWN signal to be in a logic high state if the data signal toggles while the buffered clock signal is in a logic high state. Counter circuits 203B increase their output count signals if the UP signal is pulsing high. Counter circuits 203B decrease their output count signals if the DOWN signal is pulsing high.

DPA control logic circuit 204 generates select signals that are transmitted to select inputs of clock selection multiplexer circuit 202A. DPA control logic circuit 204 generates the select signals based on the output count signals of counter circuits 203B. Based on changes in the output count signals of counter circuits 203B, DPA control logic 204 causes clock selection multiplexer circuit 202A to increase or decrease the phase of the selected clock signal SCS by selecting a different clock signal from among signals PH[15:0].

Figure 2B:
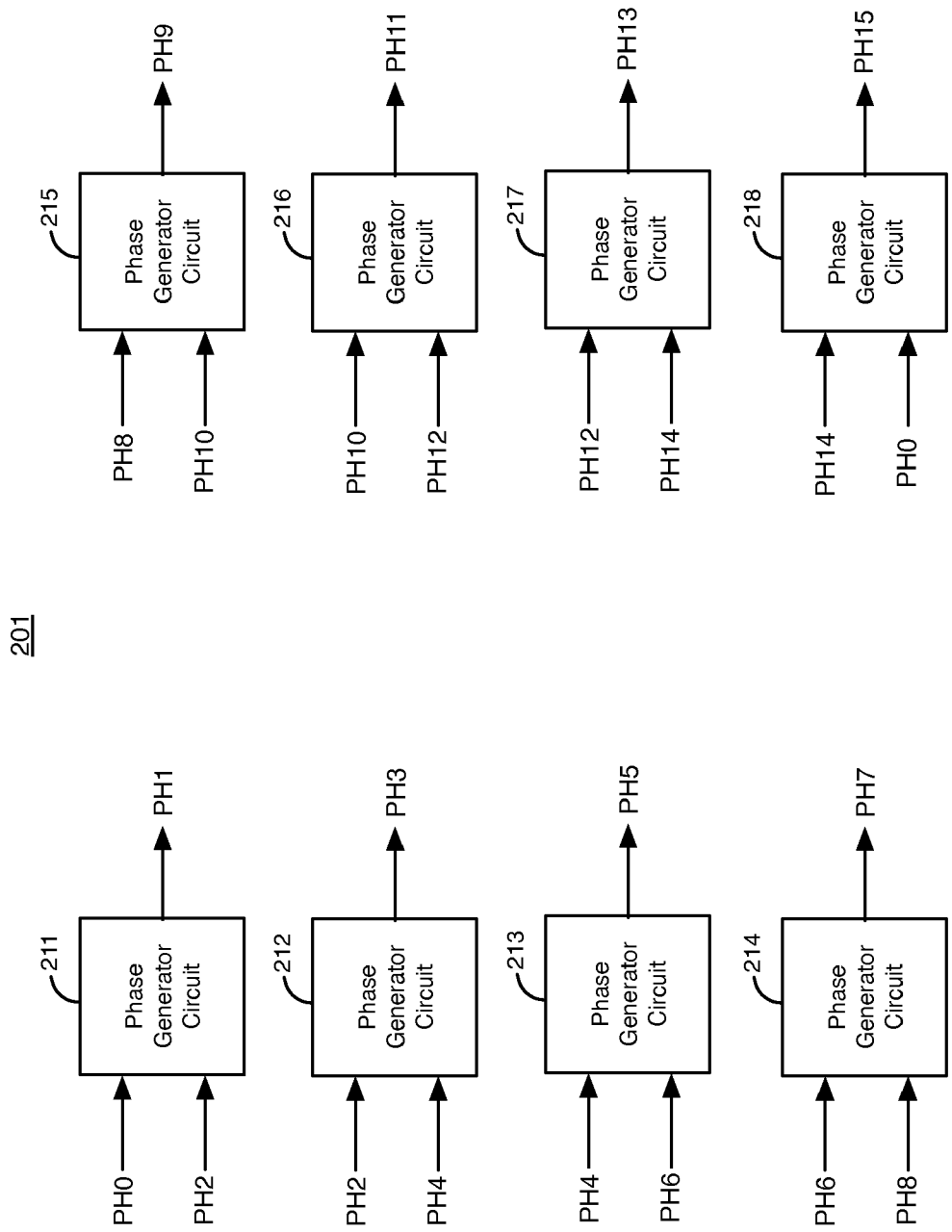
FIG. 2B illustrates further details of a phase generator circuit, according to an embodiment of the present invention.

FIG. 2B illustrates further details of phase generator circuit 201, according to an embodiment of the present invention. Phase generator circuit 201 includes 8 component phase generator circuits 211-218. Phase generator circuit 201 receives the 8 clock signals PH0, PH2, PH4, PH6, PH8, PH10, PH12, and PH14 as input signals. Phase generator circuit 201 generates 8 clock signals PH1, PH3, PH5, PH7, PH9, PH11, PH13, and PH15. Phase generator circuit 201 outputs 16 clock signals PH0, PH1, PH2, PH3, PH4, PH5, PH6, PH7, PH8, PH9, PH10, PH11, PH12, PH13, PH14, and PH15.

Phase generator circuit 211 generates clock signal PH1 in response to input clock signals PH0 and PH2. Phase generator circuit 212 generates clock signal PH3 in response to input clock signals PH2 and PH4. Phase generator circuit 213 generates clock signal PH5 in response to input clock signals PH4 and PH6. Phase generator circuit 214 generates clock signal PH7 in response to input clock signals PH6 and PH8. Phase generator circuit 215 generates clock signal PH9 in response to input clock signals PH8 and PH10. Phase generator circuit 216 generates clock signal PH11 in response to input clock signals PH10 and PH12. Phase generator circuit 217 generates clock signal PH13 in response to input clock signals PH12 and PH14. Phase generator circuit 218 generates clock signal PH15 in response to input clock signals PH14 and PH0.

Figure 3:
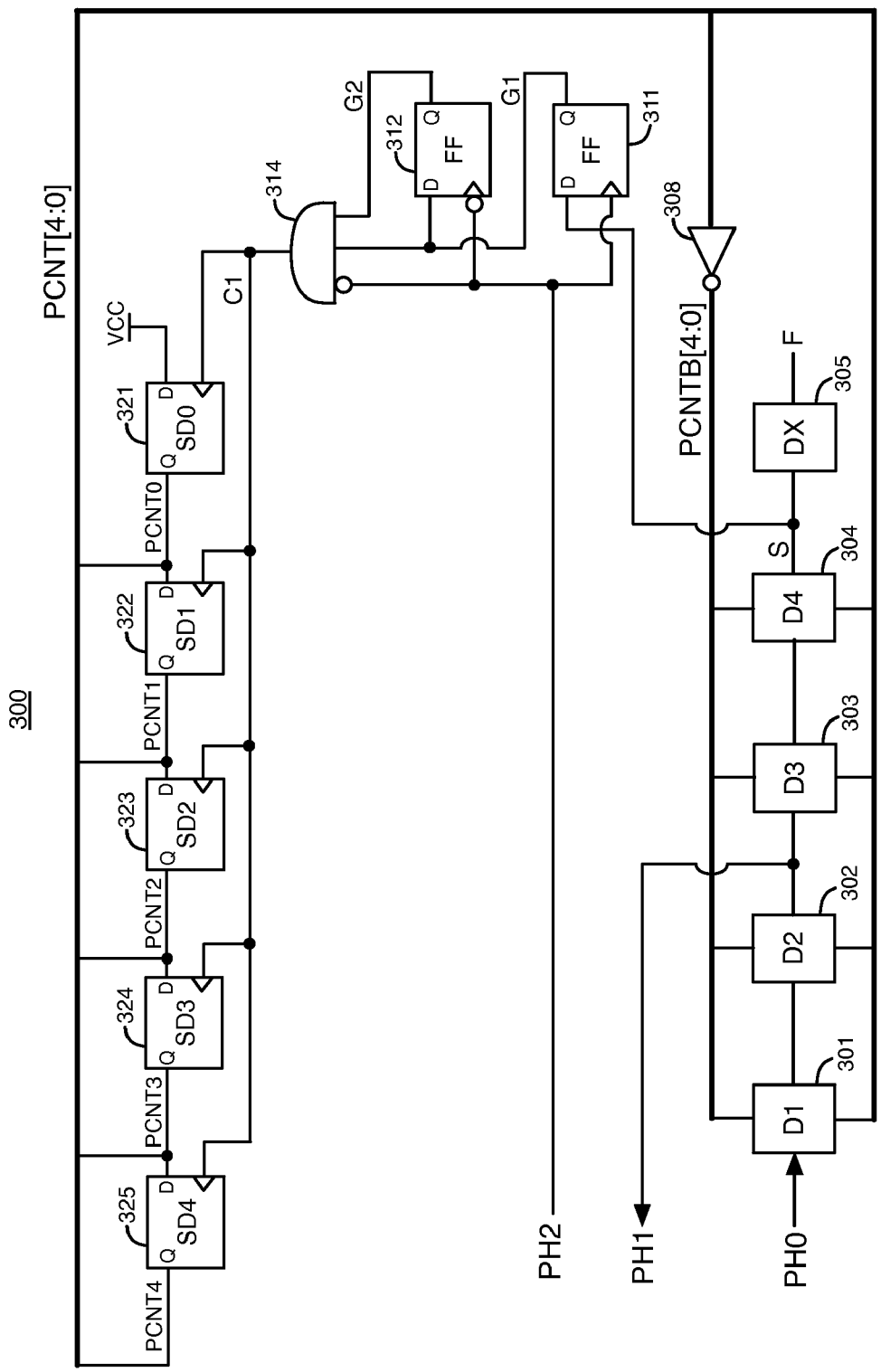
FIG. 3 illustrates an example of a phase generator circuit, according to an embodiment of the present invention.

FIG. 3 illustrates an example of a phase generator circuit 300 according to an embodiment of the present invention. Phase generator circuit 300 is an example of each of the phase generator circuits 211-218 shown in FIG. 2B. In an embodiment, phase generator circuit 201 has 8 phase generator circuits 300 that generate 8 output clock signals PH1, PH3, PH5, PH7, PH9, PH11, PH13, and PH15 in response to the 8 input clock signals PH0, PH2, PH4, PH6, PH8, PH10, PH12, and PH14.

The phase generator circuits in FIGS. 3 and 8-14 are shown as generating output clock signal PH1 in response to input clock signals PH0 and PH2 as examples of phase generator circuit 211. The same architecture that is shown for the phase generator circuits in any of FIGS. 3 and 8-14 can be used to implement each of the phase generator circuits 212-218 as well as phase generator circuit 211. The generated output clock signal PH1 shown in FIG. 3 is replaced by clock signals PH3, PH5, PH7, PH9, PH11, PH13, and PH15 in circuits 212-218, respectively. The input clock signals PH0 and PH2 shown in FIG. 3 are replaced by clock signals PH2 and PH4, PH4 and PH6, PH6 and PH8, PH8 and PH10, PH10 and PH12, PH12 and PH14, and PH14 and PH0, respectively, in circuits 212-218.

Phase generator circuit 300 generates an output clock signal PH1 having a phase that is halfway between the phases of two input clock signals PH0 and PH2. Phase generator circuit 300 and each of the other phase generator circuits shown in and described with respect to FIGS. 8-14 functions as a delay-locked loop circuit. Each of the phase generator circuits shown in FIGS. 3 and 8-14 includes a phase comparator circuit, a shift register circuit, and a delay chain of adjustable delay circuits coupled in series.

Phase generator circuit 300 includes delay circuits 301-305, CMOS inverter circuits 308, D flip-flops 311-312, AND logic gate 314, and D flip-flops 321-325. Delay circuits 301-305 are coupled in series to delay input clock signal PH0. Delay circuits 301-302 delay input clock signal PH0 to generate output clock signal PH1 at the output of delay circuit 302. Delay circuits 303-304 delay clock signal PH1 to generate delayed clock signal S at the output of delay circuit 304. Delay circuit 305 delays clock signal S to generate clock signal F. Delay circuit 305 is added so that the output loading of delay circuit 304 matches the output loading of delay circuits 301-303.

Delay circuits 301-304 are adjustable delay circuits. The delays of delay circuits 301-304 are controlled by control signals PCNT[4:0] and PCNTB[4:0]. The delays of delay circuits 301-304 vary in response to changes in the logic states of control signals PCNT[4:0] and PCNTB[4:0]. Flip-flops 321-325 generate control signals PCNT[4:0]. Inverters 308 invert each of the 5 control signals PCNT[4:0] to generate 5 inverted control signals PCNTB[4:0].

Figure 4:
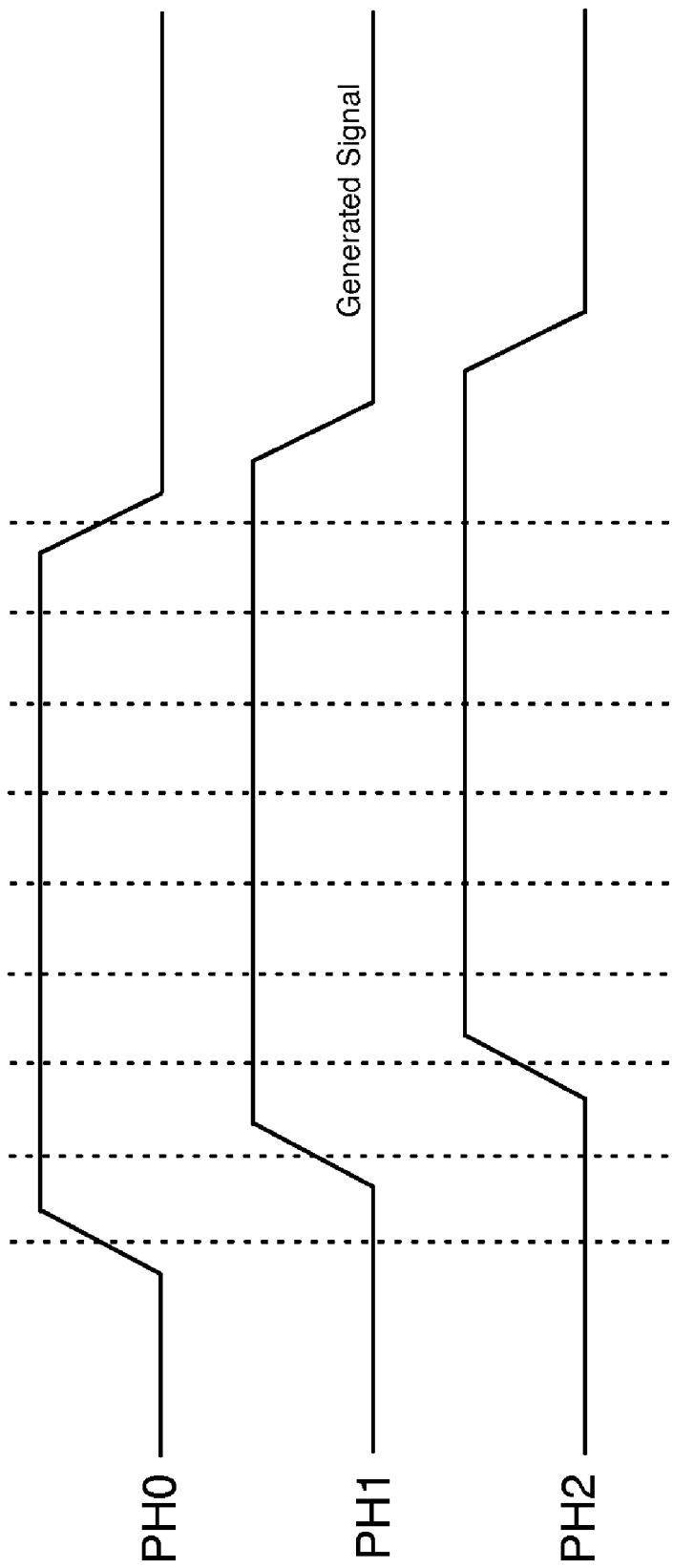
FIG. 4 is a timing diagram that illustrates an example of clock signals PH0, PH1, and PH2, according to an embodiment of the present invention.

FIG. 4 is a timing diagram that illustrates an example of clock signals PH0, PH1, and PH2, according to an embodiment of the present invention. As shown in FIG. 4, phase generator circuit 300 when implemented as circuit 211 causes the rising edges of PH1 to occur halfway in between the rising edges of PH0 and PH2. Phase generator circuit 211/300 also causes the falling edges of PH1 to occur halfway between the falling edges of PH0 and PH2. Thus, phase generator circuit 300 causes the phase of PH1 to occur halfway between the phases of PH0 and PH2.

Figure 5:
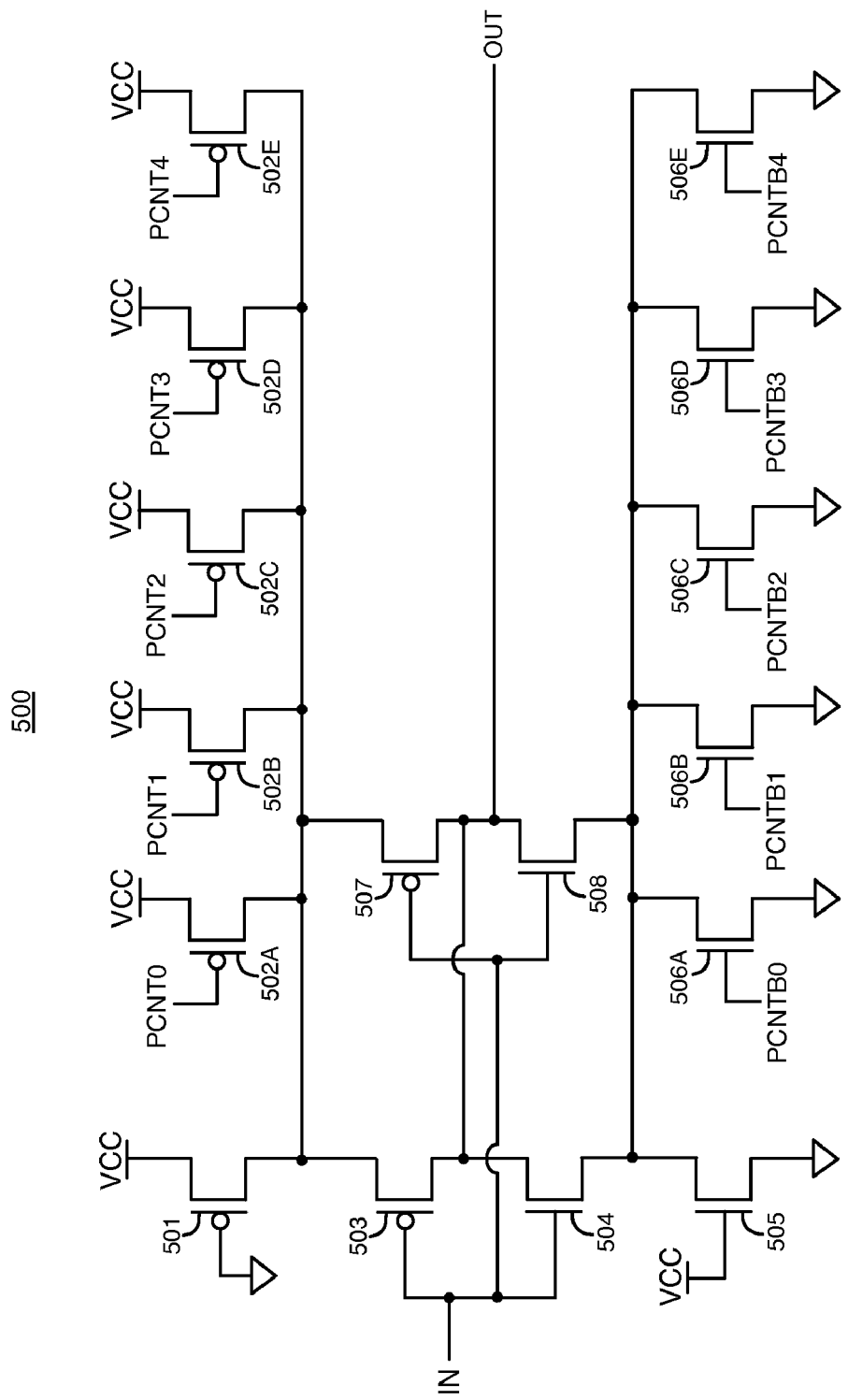
FIG. 5 illustrates an example of an adjustable delay circuit, according to an embodiment of the present invention.

FIG. 5 illustrates an example of an adjustable delay circuit 500, according to an embodiment of the present invention. Adjustable delay circuit 500 is an example of each of the adjustable delay circuits 301-304. Adjustable delay circuit 500 includes p-channel metal oxide semiconductor field-effect transistors (MOSFETs) 501, 503, 507, and 502A-502E. Circuit 500 also includes n-channel MOSFETs 504, 505, 508, and 506A-506E.

Transistors 503-504 are coupled together to form an inverter. Transistors 507-508 are also coupled to form an inverter. The gate terminals of transistors 503-504 and 507-508 are coupled to receive input clock signal IN. A delayed output clock signal OUT is generated at the drains of transistors 503-504 and 507-508. Circuit 500 delays IN to generate OUT. Thus, clock signal OUT is a delayed version of clock signal IN.

The gate of p-channel transistor 501 is coupled to ground, the source of transistor 501 is coupled to supply voltage VCC, and the drain of transistor 501 is coupled to the source of transistor 503. When the supply voltage VCC is at its nominal operating voltage, transistor 501 is on to conduct current in its saturation region from supply voltage VCC to transistor 503. The gate of n-channel transistor 505 is coupled to supply voltage VCC, the source of transistor 505 is coupled to ground, and the drain of transistor 505 is coupled to the source of transistor 504. When the supply voltage VCC is at its nominal operating voltage, transistor 505 is on to conduct current in its saturation region from transistor 504 to ground.

P-channel transistors 502A-502E are coupled in parallel between the supply voltage VCC and the sources of transistors 503 and 507. N-channel transistors 506A-506E are coupled in parallel between ground and the sources of transistors 504 and 508.

Control signals PCNT0, PCNT1, PCNT2, PCNT3, and PCNT4 (i.e., PCNT[4:0]) are transmitted to the gates of p-channel transistors 502A-502E, respectively. Control signals PCNTB0, PCNTB1, PCNTB2, PCNTB3, and PCNTB4 (i.e., PCNTB[4:0]) are transmitted to the gates of n-channel transistors 506A-506E, respectively. The logic states of the PCNT[4:0] and PCNTB[4:0] signals determine the number of transistors 502A-502E and 506A-506E that are on and the number of transistors 502A-502E and 506A-506E that are off. Signals PCNT[4:0] and signals PCNTB[4:0], respectively, are complementary signals.

A logic high state (1) at the gate of a p-channel transistor turns off that transistor, and a logic low state (0) at the gate of a p-channel transistor turns on that transistor in its saturation region. A logic low state (0) at the gate of an n-channel transistor turns off that transistor, and a logic high state (1) at the gate of an n-channel transistor turns on that transistor in its saturation region.

Each increase in the number of is in signals PCNT[4:0] decreases the current through adjustable delay circuit 500, which causes the delay provided to output clock signal OUT to increase relative to input clock signal IN. Each decrease in the number of is in signals PCNT[4:0] increases the current through adjustable delay circuit 500, which causes the delay provided to output clock signal OUT to decrease relative to input clock signal IN.

Figure 6:
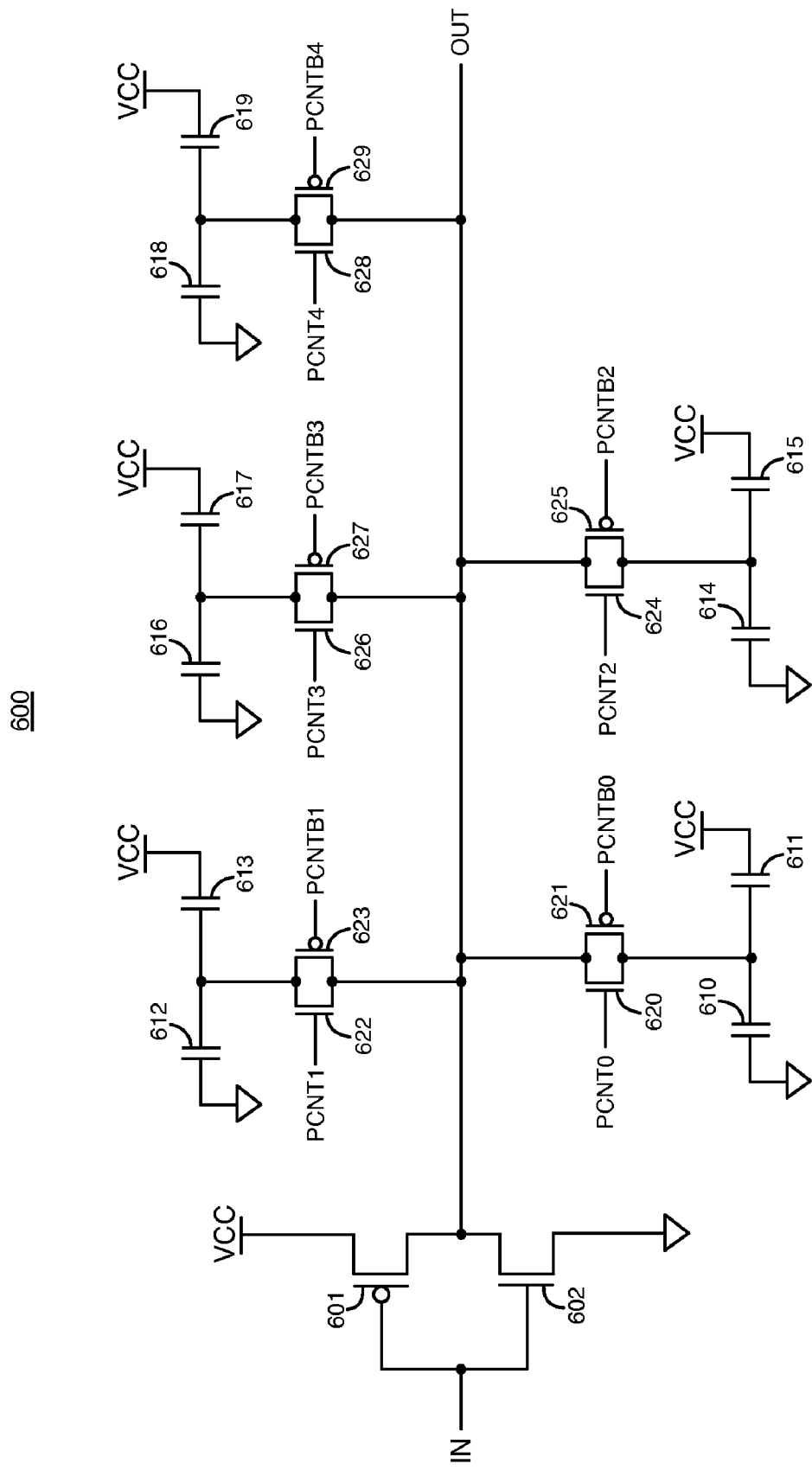
FIG. 6 illustrates another example of an adjustable delay circuit, according to an embodiment of the present invention.

FIG. 6 illustrates another example of an adjustable delay circuit 600, according to an embodiment of the present invention. Adjustable delay circuit 600 is an example of each of the adjustable delay circuits 301-304. Adjustable delay circuit 600 includes p-channel MOSFETs 601, 621, 623, 625, 627, and 629. Circuit 600 also includes n-channel MOSFETs 602, 620, 622, 624, 626, and 628. Circuit 600 also includes capacitors 610-619. Capacitors 610, 612, 614, 616, and 618 may be implemented, for example, by n-channel MOSFETs. Capacitors 611, 613, 615, 617, and 619 may be implemented, for example, by p-channel MOSFETs.

The gate terminals of transistors 601-602 receive input clock signal IN. A delayed output clock signal OUT is generated at the drains of transistors 601-602. Circuit 600 delays IN to generate OUT. Clock signal OUT is a delayed inverted version of clock signal IN.

Control signals PCNT0, PCNT1, PCNT2, PCNT3, and PCNT4 control the gate voltages of n-channel transistors 620, 622, 624, 626, and 628, respectively. Control signals PCNTB0, PCNTB1, PCNTB2, PCNTB3, and PCNTB4 control the gate voltages of p-channel transistors 621, 623, 625, 627, and 629, respectively. Each pair of p-channel and n-channel transistors coupled together in parallel in FIG. 6 forms a pass gate.

Control signals PCNT0 and PCNTB0 cause transistors 620-621 to couple or decouple capacitors 610-611 to or from the output terminal at output clock signal OUT. Control signals PCNT1 and PCNTB1 cause transistors 622-623 to couple or decouple capacitors 612-613 to or from the output terminal at output clock signal OUT. Control signals PCNT2 and PCNTB2 cause transistors 624-625 to couple or decouple capacitors 614-615 to or from the output terminal at output clock signal OUT. Control signals PCNT3 and PCNTB3 cause transistors 626-627 to couple or decouple capacitors 616-617 to or from the output terminal at output clock signal OUT. Control signals PCNT4 and PCNTB4 cause transistors 628-629 to couple or decouple capacitors 618-619 to or from the output terminal at output clock signal OUT.

Each increase in the number of is in signals PCNT[4:0] increases the number of capacitors that are coupled to the output terminal at OUT, which causes the delay provided to output clock signal OUT to increase relative to input clock signal IN. Each decrease in the number of is in signals PCNT[4:0] decreases the number of capacitors that are coupled to the output terminal at OUT, which causes the delay provided to output clock signal OUT to decrease relative to input clock signal IN.

Figure 7:
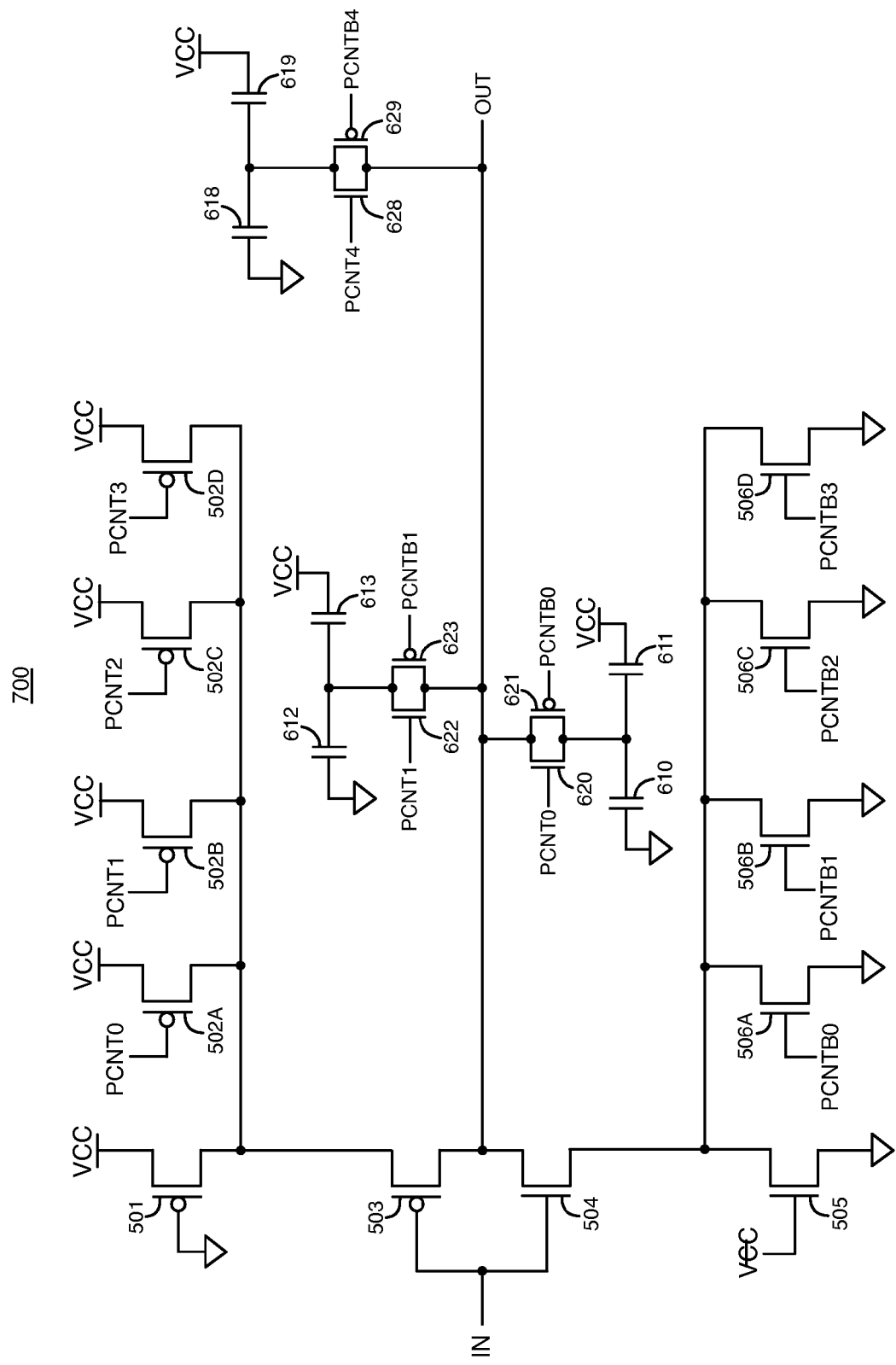
FIG. 7 illustrates another example of an adjustable delay circuit, according to an embodiment of the present invention.

FIG. 7 illustrates another example of an adjustable delay circuit 700, according to an embodiment of the present invention. Adjustable delay circuit 700 is an example of each of the adjustable delay circuits 301-304. Adjustable delay circuit 700 includes p-channel MOSFETs 501, 503, 502A-502D, 621, 623, and 629. Circuit 700 also includes n-channel MOSFETs 504, 505, 506A-506D, 620, 622, and 628. Circuit 700 also includes capacitors 610-613 and 618-619.

Adjustable delay circuit 700 is a hybrid delay circuit that includes transistors shown in FIG. 5 as well as capacitors and transistors that are shown in FIG. 6. The gate terminals of transistors 503-504 receive input clock signal IN. A delayed and inverted output clock signal OUT is generated at the drains of transistors 503-504. Circuit 700 delays IN to generate OUT. Clock signal OUT is a delayed inverted version of clock signal IN.

In circuit 700, each increase in the number of is in signals PCNT[4:0] increases the delay provided to output clock signal OUT relative to input clock signal IN by turning off more of the transistor pairs 502/506 and/or coupling more of the capacitors to the output terminal at OUT. Each decrease in the number of is in signals PCNT[4:0] decreases the delay provided to output clock signal OUT relative to input clock signal IN by turning on more of the transistor pairs 502/506 and/or decoupling more of the capacitors from the output terminal at OUT.

Referring again to FIG. 3, clock signal PH2 is transmitted to the clock and clock bar inputs of flip-flops 311 and 312, respectively. Delayed clock signal S is transmitted from the output of delay circuit 304 to the D input of flip-flop 311. Flip-flop 311 stores the logic state of clock signal S at its Q output as signal G1 at each rising edge of PH2. Signal G1 is transmitted to the D input of flip-flop 312 and to an input of AND gate 314. Flip-flop 312 stores the logic state of signal G1 at its Q output as signal G2 at each falling edge of PH2. AND gate 314 inverts the PH2 signal using an inverter to generate an inverted PH2 signal. AND gate 314 performs a Boolean AND function on the inverted PH2 signal, the G1 signal, and the G2 signal to generate signal C1. AND gate 314 and flip-flops 311-312 function as a phase comparator circuit that compares the phases of clock signals PH2 and S to generate phase comparison signal C1.

When the S clock signal is in a logic high state during a rising edge of the PH2 clock signal, flip-flop 311 stores a logic high state at its Q output in signal G1. On the next falling edge of the PH2 clock signal, flip-flop 312 stores the logic high state of G1 at its Q output in signal G2. AND gate 314 then generates a rising edge in its output signal C1, because all three of the G1, G2, and inverted PH2 signals are in logic high states.

Before phase generator 300 is enabled, signals PCNT[4:0] are all cleared to logic low states, and inverters 308 drive all of the signals PCNTB[4:0] to logic high states. As a result, delay circuits 301-304 are set to generate the minimum delays in their output clock signals.

The output signal C1 of AND gate 314 is transmitted to the clock input of each of flip-flops 321-325. The high supply voltage VCC is transmitted to the D input of flip-flop 321. Flip-flops 321-325 are coupled together in series to form a serial shift register.

If a first rising edge occurs in signal C1, flip-flop 321 stores a logic high state (VCC) at its Q output in control signal PCNT0 on the first rising edge of C1. If a second rising edge occurs in signal C1, flip-flop 322 stores the logic high state of control signal PCNT0 at its Q output in control signal PCNT1 on the second rising edge of C1. If a third rising edge occurs in signal C1, flip-flop 323 stores the logic high state of control signal PCNT1 at its Q output in control signal PCNT2 on the third rising edge of C1. If a fourth rising edge occurs in signal C1, flip-flop 324 stores the logic high state of control signal PCNT2 at its Q output in control signal PCNT3 on the fourth rising edge of C1. If a fifth rising edge occurs in signal C1, flip-flop 325 stores the logic high state of control signal PCNT3 at its Q output in control signal PCNT4 on the fifth rising edge of C1.

Each additional rising edge in the C1 signal causes flip-flops 321-325 to generate an additional 1 (i.e., logic high state) in the PCNT[4:0] signals. Each additional 1 in the PCNT[4:0] signals causes the delay of each of the adjustable delay circuits 301-304 to increase by a delay increment, causing the phase of clock signal S to occur later in time. Phase generator circuit 300 continues to generate rising and falling edges in signal C1 until clock signal S is in a logic low state on the rising edges of clock signal PH2. Phase generator circuit 300 generates enough rising edges in C1 to cause clock signal S to be phase aligned or approximately phase aligned with clock signal PH2.

When the S clock signal is in a logic low state on a rising edge of the PH2 clock signal, flip-flop 311 stores a logic low state at its Q output in signal G1. On the next falling edge of the PH2 clock signal, flip-flop 312 stores the logic low state of G1 at its Q output in signal G2. The output signal C1 of AND gate 314 is in a logic low state when one of the inverted PH2 signal, the G1 signal, or the G2 signal is in a logic low state.

Phase generator circuit 300 may generate 0, 1, 2, 3, 4, or 5 rising edges in signal C1 in order to align the phases of clock signals S and PH2, depending on the delay increments of delay circuits 301-304. When clock signal S is low on the rising edges of PH2, signal C1 remains in a logic low state, and the logic states of control signals PCNT[4:0] and PCNTB [4:0] remain constant. When clock signals S and PH2 are aligned in phase or nearly aligned in phase, the phase of output clock signal PH1 occurs approximately halfway between the phases of PH0 and PH2. For example, if the phases of clock signals PH0 and PH2 are 0° and 45°, respectively, phase generator circuit 300 drives the phase of clock signal PH1 to 22.5°. Flip-flops 321-325 can only increase the delays of delay circuits 301-304 in circuit 300.

Figure 8:
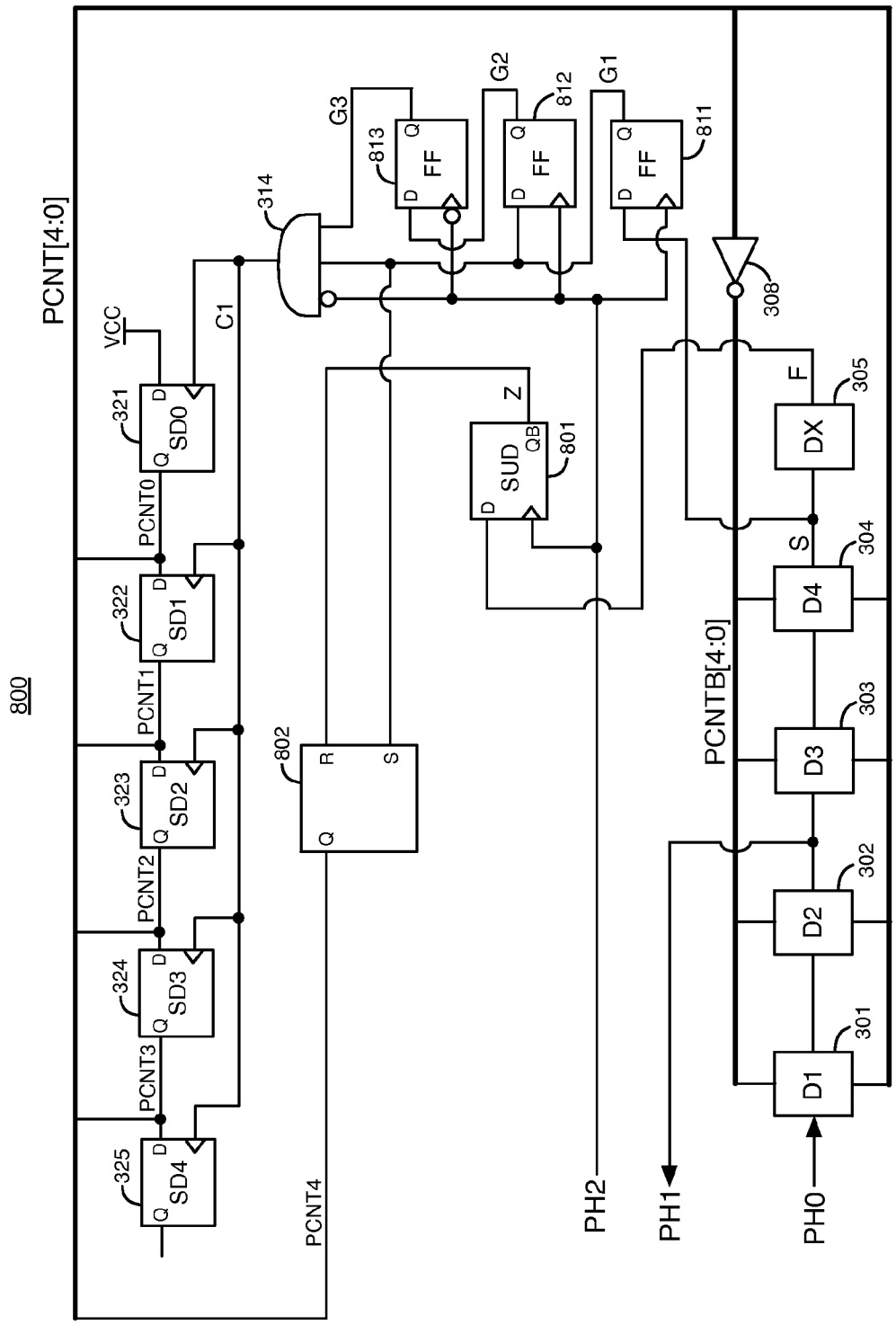
FIG. 8 illustrates another example of a phase generator circuit, according to an embodiment of the present invention.

FIG. 8 illustrates an example of a phase generator circuit 800 according to an embodiment of the present invention. Phase generator circuit 800 can be used to implement each of the phase generator circuits 211-218 shown in FIG. 2B. In an embodiment, phase generator circuit 201 has 8 phase generator circuits 800 that generate 8 output clock signals PH1, PH3, PH5, PH7, PH9, PH11, PH13, and PH15 in response to the 8 input clock signals PH0, PH2, PH4, PH6, PH8, PH10, PH12, and PH14.

Phase generator circuit 800 can increase or decrease the phase of its generated output clock signal PH1. Phase generator circuit 800 includes delay circuits 301-305, CMOS inverter circuits 308, D flip-flops 811-813, D flip-flop 801, AND logic gate 314, D flip-flops 321-325, and SR flip-flop 802. SR flip-flop 802 generates the PCNT4 signal at its Q output. The Q output of flip-flop 325 does not control the delays of circuits 301-304 in circuit 800.

Clock signal PH2 is transmitted to the clock inputs of flip-flops 811-812. PH2 is transmitted to the clock bar input of flip-flop 813. Delayed clock signal S is transmitted from the output of delay circuit 304 to the D input of flip-flop 811. Flip-flop 811 stores the logic state of clock signal S at its Q output in signal G1 at each rising edge of PH2. Signal G1 is transmitted to the D input of flip-flop 812, to an input of AND gate 314, and to the set S input of flip-flop 802. Flip-flop 812 stores the logic state of signal G1 at its Q output in signal G2 at each rising edge of PH2.

Signal G2 is transmitted to the D input of flip-flop 813. Flip-flop 813 stores the logic state of signal G2 at its Q output in signal G3 at each falling edge of PH2. Signal G3 is transmitted to an input of AND gate 314. AND gate 314 performs a Boolean AND function on the inverted PH2 signal, the G1 signal, and the G3 signal to generate signal C1. Circuit 800 has 3 flip-flops 811-813 to filter out noise in C1 caused by clock signals PH0, PH2, and/or S. AND gate 314 and flip-flops 811-813 function as a phase comparator circuit that compares the phases of clock signals PH2 and S to generate phase comparison signals G1 and C1.

Initially, signals PCNT[4:0] are all cleared to logic low states, signals PCNTB[4:0] are all in logic high states, and delay circuits 301-304 are set to their minimum delays. When the S clock signal is in a logic high state on the rising edge of the PH2 clock signal, flip-flop 811 stores a logic high state at its Q output in signal G1. The logic high state of signal G1 sets flip-flop 802, causing the PCNT4 signal to transition to a logic high state. After PCNT4 transitions high, the delay of each of the delay circuits 301-304 increases by a delay increment.

On the next rising edge of the PH2 clock signal, flip-flop 812 stores a logic high state at its Q output in signal G2, and output signal G1 of flip-flop 811 remains in a logic high state if the S clock signal is in a logic high state on that rising edge of PH2. On the next falling edge of PH2, flip-flop 813 stores a logic high state at its Q output in signal G3. AND gate 314 then generates a rising edge in signal C1 in response to all three of the G1, G3, and inverted PH2 signals concurrently being in logic high states.

Each rising edge in the C1 signal causes flip-flops 321-324 to generate an additional 1 in the PCNT[3:0] signals. Each additional 1 in the PCNT[3:0] signals causes the delay of each of delay circuits 301-304 to increase by an additional delay increment, causing the phase of clock signal S to occur later in time. Phase generator circuit 800 continues to generate rising and falling edges in signal C1 until clock signal S is in a logic low state on the rising edges of clock signal PH2. Phase generator circuit 800 generates enough rising edges in C1 to cause clock signal S to be phase aligned or approximately phase aligned with clock signal PH2.

When the S clock signal is in a logic low state on the rising edge of the PH2 clock signal, flip-flop 811 stores a logic low state at its Q output in signal G1. On the next rising edge of PH2, flip-flop 812 stores a logic low state in signal G2 at its Q output. On the next falling edge of the PH2 clock signal, flip-flop 813 stores a logic low state at its Q output in signal G3. The output signal C1 of AND gate 314 is in a logic low state after signal G1 transitions low.

Phase generator circuit 800 may generate 0, 1, 2, 3, or 4 rising edges in signal C1 in order to align the phases of clock signals S and PH2, depending on the delay increments of delay circuits 301-304. If clock signal S is low on the rising edges of PH2, signal C1 remains in a logic low state, and the logic states of control signals PCNT[3:0] and PCNTB[3:0] remain constant. When clock signals S and PH2 are aligned in phase or nearly aligned in phase, the phase of output clock signal PH1 occurs approximately halfway between the phases of PH0 and PH2, as shown, for example, in FIG. 4.

During the operation of phase generator circuit 800, a change in the temperature of the circuit may cause the phase of clock signal PH1 to shift such that the phase of PH1 is no longer halfway between the phases of PH0 and PH2. Flip-flops 321-324 can only increase the delays of delay circuits 301-304 in circuit 800. After a logic high state is stored at the Q output of any of flip-flops 321-325, the Q output of that flip-flop remains in a logic high state during the operation of circuit 800. After signals PCNT[3:0] are all in logic high states in circuit 800, signals PCNT[3:0] remain in logic high states during the operation of circuit 800.

Flip-flop 802 can cause the delays of delay circuits 301-304 to increase or decrease by changing the logic state of PCNT4. As described above, flip-flop 811 sets flip-flop 802 causing PCNT4 to transition high after signal G1 transitions high, during the initial phase alignment mode of circuit 800. Flip-flop 802 can also be reset to cause PCNT4 to transition low to decrease the delays of delay circuits 301-304, for example, after a temperature change in circuit 800.

The PH2 clock signal is transmitted to the clock input of D flip-flop 801. Delay circuit 305 delays clock signal S to generate clock signal F. The delay that delay circuit 305 provides to clock signal F relative to clock signal S is preferably much smaller than the delay of delay circuit 304. The delayed clock signal F is transmitted to the D input of flip-flop 801. Flip-flop 801 stores the logical inverse of the logic state of clock signal F at its QB output in signal Z at each rising edge of clock signal PH2. If signal F is in a logic low state on a rising edge in PH2, flip-flop 801 resets flip-flop 802, causing the PCNT4 signal to transition to a logic low state. After signal PCNT4 transitions low, the delay of each of delay circuits 301-304 decreases by a delay increment. According to a particular embodiment, signal PCNT4 can control a transistor pair or capacitor pair in each adjustable delay circuit that generates a smaller delay increment than the other transistor or capacitor pairs.

Figure 9:
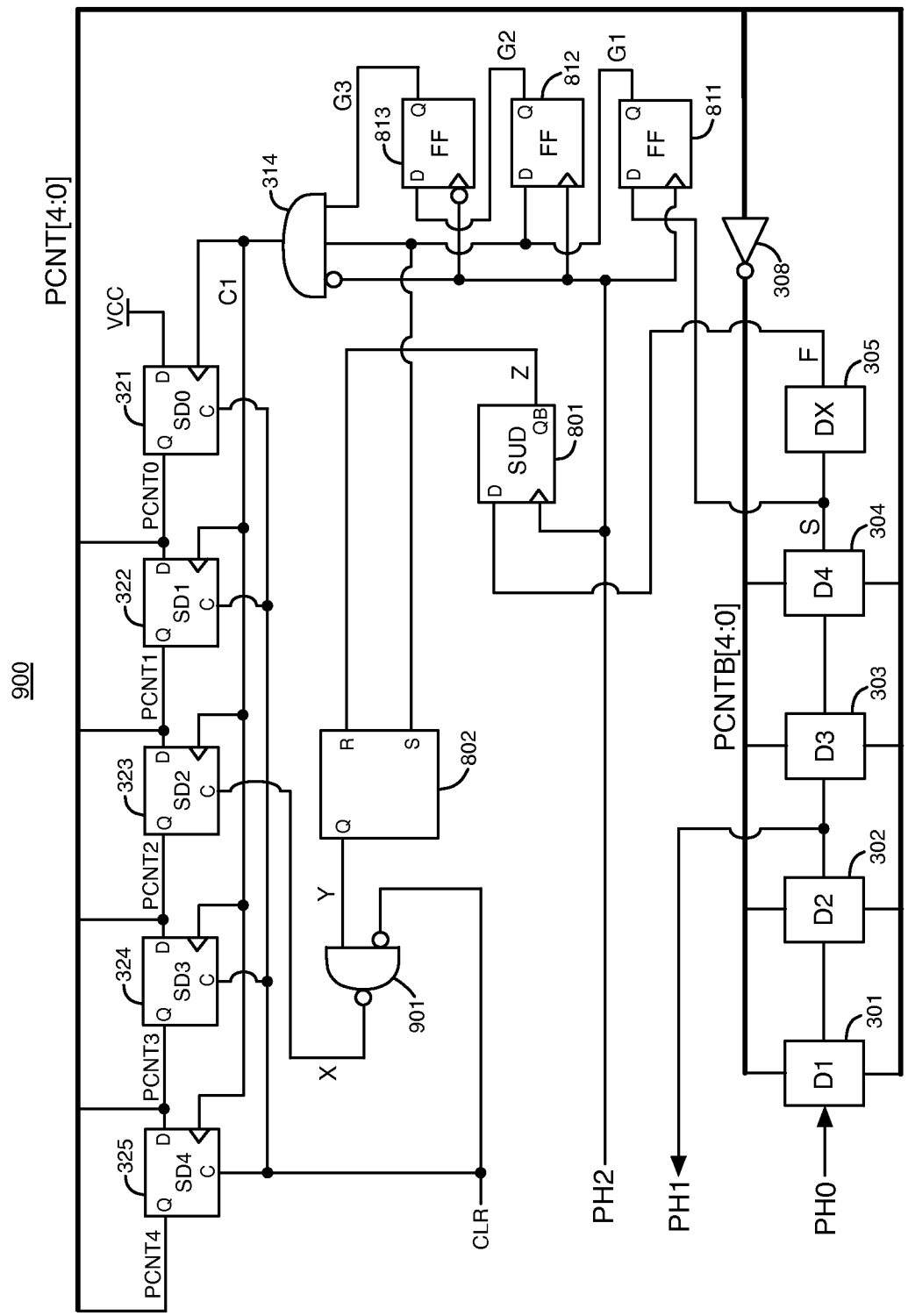
FIG. 9 illustrates another example of a phase generator circuit, according to an embodiment of the present invention.

FIG. 9 illustrates another example of a phase generator circuit 900, according to an embodiment of the present invention. Phase generator circuit 900 can be used to implement each of the phase generator circuits 211-218 shown in FIG. 2B. In an embodiment, phase generator circuit 201 has 8 phase generator circuits 900 that generate 8 output clock signals PH1, PH3, PH5, PH7, PH9, PH11, PH13, and PH15 in response to the 8 input clock signals PH0, PH2, PH4, PH6, PH8, PH10, PH12, and PH14.

Phase generator circuit 900 can increase or decrease the phase of its generated output clock signal PH1. Phase generator circuit 900 includes delay circuits 301-305, CMOS inverter circuits 308, D flip-flops 811-813, D flip-flop 801, AND logic gate 314, D flip-flops 321-325, SR flip-flop 802, and NAND logic gate 901. SR flip-flop 802 generates a signal Y at its Q output that is transmitted to a first input of NAND gate 901. An input clear signal CLR is transmitted to a second inverting input of NAND gate 901 and to the clear C inputs of each of flip-flops 321-322 and 324-325. The Q output of flip-flop 325 generates the PCNT4 signal that controls the delays of circuits 301-304, as described above with respect to circuit 300.

The output signal X of NAND gate 901 is transmitted to the clear C input of flip-flop 323. NAND gate 901 generates a rising edge in its output signal X after flip-flop 802 resets the Y signal to a logic low state. NAND gate 901 also generates a rising edge in its output signal X after the CLR input signal transitions from a logic low state to a logic high state. A rising edge in the output signal X of NAND gate 901 causes flip-flop 323 to clear the logic state of the PCNT2 signal to a logic low state. A rising edge in the CLR input signal causes flip-flops 321-325 to clear the logic states of the PCNT0, PCNT1, PCNT2, PCNT3, and PCNT4 signals to logic low states.

Before phase generator 900 is enabled, a logic high pulse is generated in the CLR input signal to clear the PCNT[4:0] signals to logic low states. Then, phase generator circuit 900 aligns the phases of clock signals S and PH2 by shifting a logic high signal from VCC through one or more of flip-flops 321-325 in response to each rising edge of signal C1. Each additional flip-flop 321-325 that stores a logic high state at its Q output causes the delay of each of delay circuits 301-304 to increase by one delay increment, as described above with respect to phase generator circuit 300.

During the operation of phase generator circuit 900, a change in the temperature of circuit 900 may cause the phase of clock signal PH1 to shift such that the phase of PH1 is no longer halfway between the phases of PH0 and PH2. Flip-flops 321-322 in circuit 900 can only increase the delays of delay circuits 301-304. After logic high states are stored at the Q outputs of flip-flops 321-322, the PCNT[1:0] signals remain in logic high states during the operation of circuit 900.

Flip-flop 802 can cause the delays of delay circuits 301-304 to decrease by causing the logic state of signal PCNT2 to transition to a logic low state. As described above with respect to circuit 800 in FIG. 8, flip-flop 801 resets flip-flop 802 when a rising edge of PH2 occurs while the F clock signal is in a logic low state. In response to a rising edge in the Z output signal of flip-flop 801, flip-flop 802 generates a falling edge in the Y signal at its Q output, which causes NAND gate 901 to generate a rising edge in the X signal. Flip-flop 323 drives signal PCNT2 at its Q output to a logic low state (0) in response to the rising edge in the X signal. The delay of each of the delay circuits 301-304 decreases by a delay increment in response to a falling edge in the PCNT2 signal. The decrease in the delays of delay circuits 301-304 may cause the phase of the PH1 signal to be halfway between the phases of PH0 and PH2.

If subsequently a change in the temperature of circuit 900 causes the rising edges of clock signal S to occur before the rising edges of PH2, a first rising edge in signal C1 causes the logic low state (0) stored in flip-flop 323 to be shifted into flip-flop 324 and a logic high state (1) to be shifted into flip-flop 323 from flip-flop 322. If a second rising edge occurs in C1, the logic low state stored in flip-flop 324 is shifted into flip-flop 325 and a logic high state is shifted into flip-flop 324 from flip-flop 323. If a third rising edge occurs in C1, the logic high state stored in flip-flop 324 is shifted into flip-flop 325. Signals PCNT[4:0] are then all 1s, and delay circuits 301-304 generate the maximum delays in their output signals.

In order to align the phases of clock signals S and PH2, NAND 901 is selected to clear the output signal of the last flip-flop 321-325 that is expected to store a logic high state. For example, if it is expected that signals PCNT[2:0] will be driven to logic high states and that signals PCNT[4:3] will remain in logic low states to align the phases of clock signals S and PH2 during the initial phase alignment mode, the output of NAND gate 901 is coupled to the clear C input of flip-flop 323, as shown in FIG. 9, to provide subsequent adjustments to the phase of PH1 to compensate for temperature changes of the circuit. According to various embodiments, the output of NAND gate 901 may be coupled to the clear C input of any of flip-flops 321-325.

Figure 10:
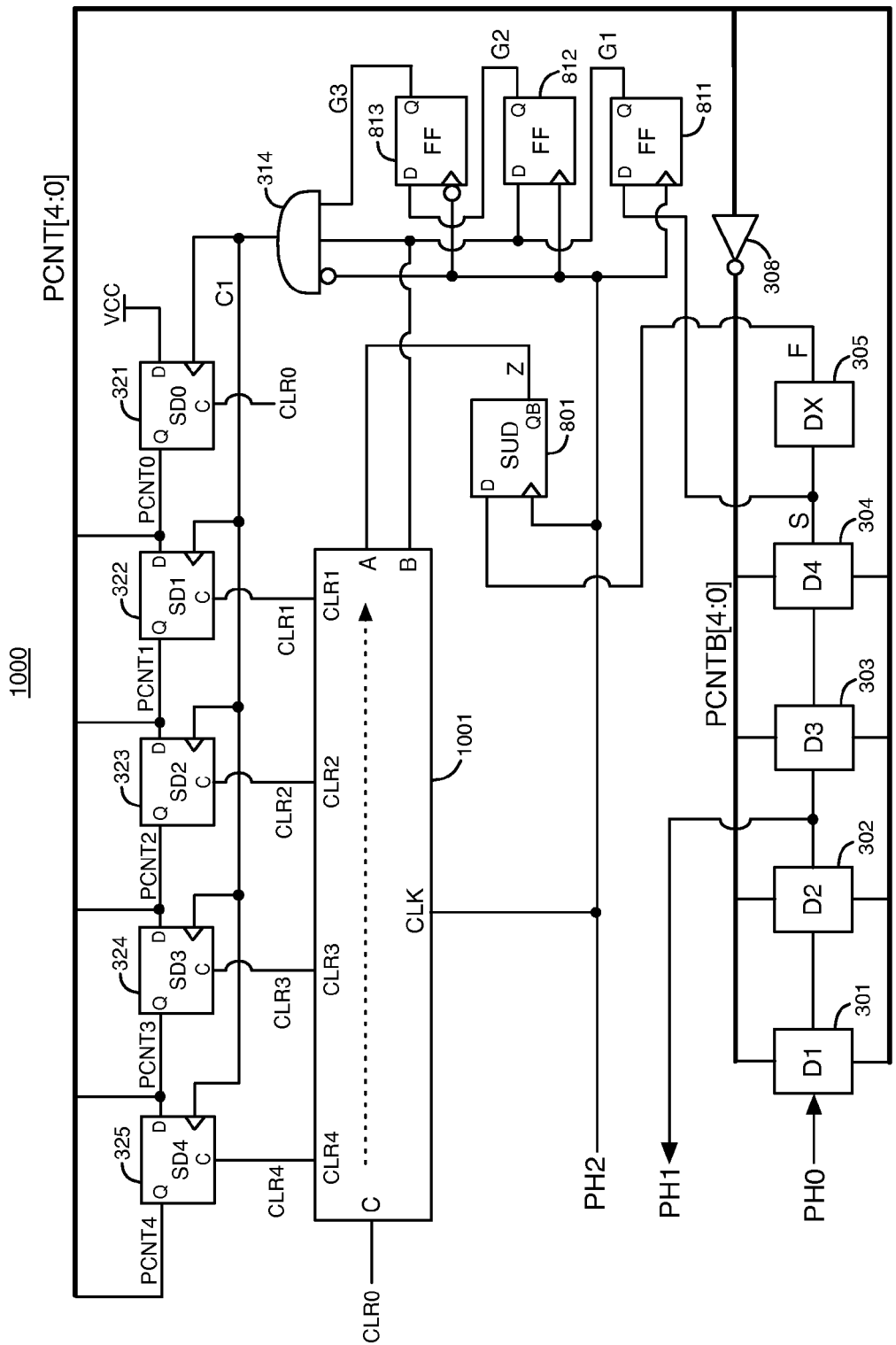
FIG. 10 illustrates another example of a phase generator circuit, according to an embodiment of the present invention.

FIG. 10 illustrates another example of a phase generator circuit 1000, according to an embodiment of the present invention. Phase generator circuit 1000 can be used to implement each of the phase generator circuits 211-218 shown in FIG. 2B. In an embodiment, phase generator circuit 201 has 8 phase generator circuits 1000 that generate 8 output clock signals PH1, PH3, PH5, PH7, PH9, PH11, PH13, and PH15 in response to the 8 input clock signals PH0, PH2, PH4, PH6, PH8, PH10, PH12, and PH14.

Phase generator circuit 1000 can increase or decrease the phase of its generated output clock signal PH1. Phase generator circuit 1000 includes delay circuits 301-305, CMOS inverter circuits 308, D flip-flops 811-813, D flip-flop 801, AND logic gate 314, D flip-flops 321-325, and logic circuit 1001. The G1 signal at the Q output of flip-flop 811 is transmitted to the B input of logic circuit 1001. The Z signal at the QB output of flip-flop 801 is transmitted to the A input of logic circuit 1001. A clear input signal CLR0 is transmitted to the C input of logic circuit 1001 and to the clear C input of flip-flop 321. The PH2 signal is transmitted to the clock CLK input of circuit 1001. Logic circuit 1001 can be, for example, a state machine.

Before phase generator 1000 is enabled, a logic high pulse is generated in the CLR0 input signal. The logic high pulse in CLR0 causes flip-flop 321 to clear the PCNT0 signal to a logic low state. The logic high pulse in CLR0 also causes logic circuit 1001 to generate logic high pulses in the CLR1-CLR4 signals at its CLR1-CLR4 outputs, causing flip-flops 322-325, respectively, to clear the PCNT[4:1] signals to logic low states.

Each time that clock signal S is in a logic high state on two consecutive rising edges of PH2, AND gate 314 subsequently generates a rising edge in signal C1, as described above with respect to phase generator circuit 800. Phase generator circuit 1000 aligns the phases of clock signals S and PH2 by shifting a logic high signal from VCC through one or more of flip-flops 321-325 in response to each rising edge of signal C1. Each additional flip-flop 321-325 that stores a logic high state at its Q output causes the delay of each of delay circuits 301-304 to increase by one delay increment, as described above with respect to phase generator circuit 300.

During the operation of phase generator circuit 1000, a change in the temperature of circuit 1000 may cause the phase of clock signal PH1 to shift such that the phase of PH1 is no longer halfway between the phases of PH0 and PH2. For example, if the temperature of circuit 1000 increases, the delays of delay circuits 301-304 may increase enough to cause clock signals S and F to be in logic low states on a rising edge of PH2. As a result, flip-flop 801 stores a logic high state in signal Z, and flip-flop 811 stores a logic low state in signal G1. Logic circuit 1001 generates a sequence of logic high pulses in the clear signals CLR1-CLR4 to clear the PCNT[4:1] signals in response to signal Z being high and signal G1 being low at the same time for multiple periods of PH2.

In response to signal Z being in a logic high state and signal G1 being in a logic low state in a first period of PH2, logic circuit 1001 initially generates a logic high pulse in clear signal CLR4. Flip-flop 325 clears the PCNT4 signal to a logic low state on a rising edge of CLR4. If signal Z remains high and signal G1 remains low in a second period of PH2, logic circuit 1001 generates a logic high pulse in clear signal CLR3. Flip-flop 324 clears the PCNT3 signal to a logic low state on a rising edge of CLR3.

If signal Z remains high and signal G1 remains low for a third period of PH2, logic circuit 1001 generates a logic high pulse in clear signal CLR2. Flip-flop 323 clears the PCNT2 signal to a logic low state on a rising edge of CLR2. If signal Z remains high and signal G1 remains low for a fourth period of PH2, logic circuit 1001 generates a logic high pulse in clear signal CLR1. Flip-flop 322 clears the PCNT1 signal to a logic low state on a rising edge of CLR1. Each additional logic low signal in the PCNT[4:0] signals decreases the delays of delay circuits 301-304 to bring the phases of clock signals S and PH2 closer to alignment.

Figure 11:
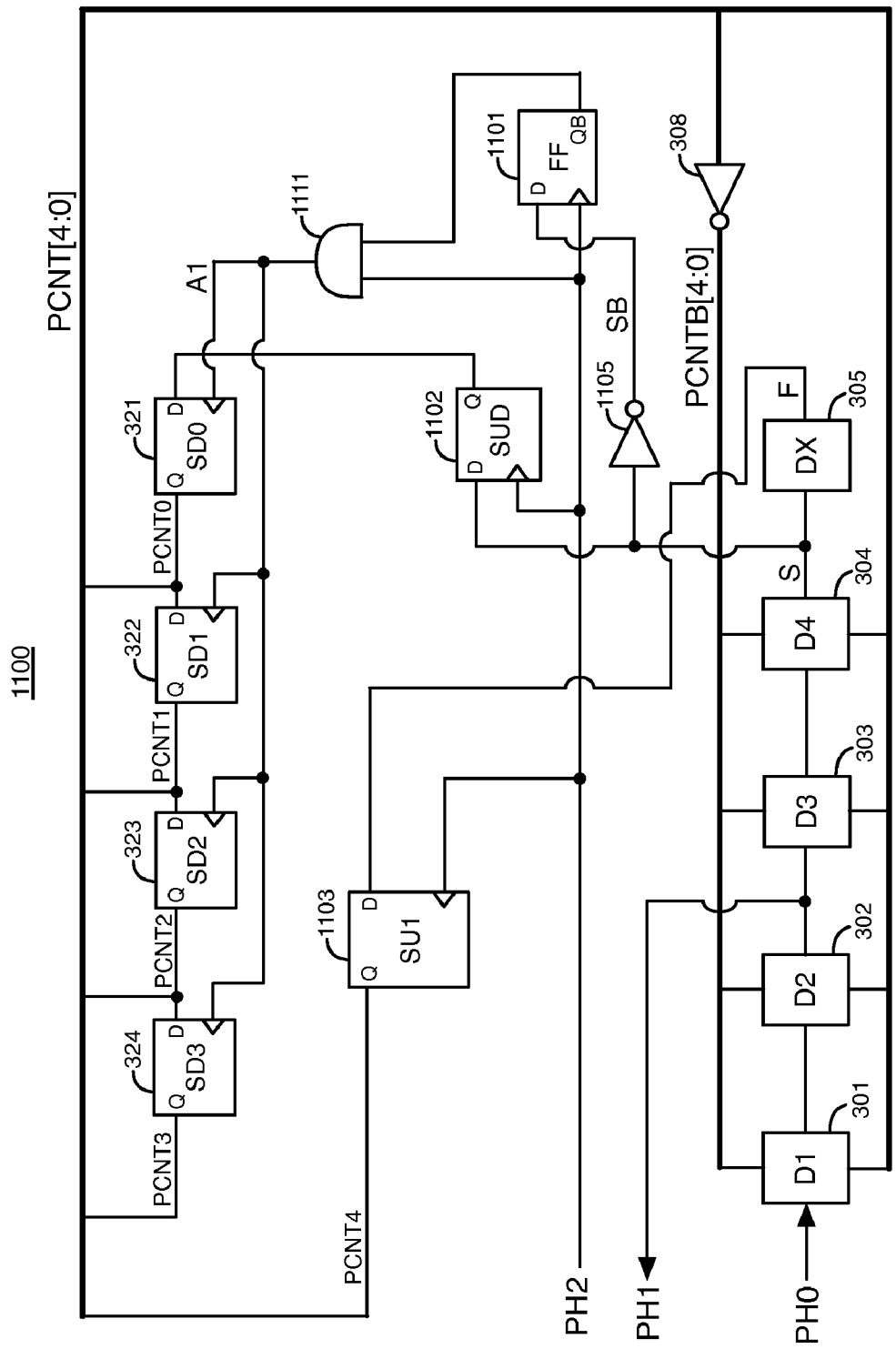
FIG. 11 illustrates another example of a phase generator circuit, according to an embodiment of the present invention.

FIG. 11 illustrates another example of a phase generator circuit 1100, according to an embodiment of the present invention. Phase generator circuit 1100 includes delay circuits 301-305, CMOS inverter circuits 308, D flip-flops 321-324, AND gate circuit 1111, D flip-flops 1101-1103, and CMOS inverter circuit 1105. Phase generator circuit 1100 can increase and decrease the delays of adjustable delay circuits 301-304 to align the phases of clock signals S and PH2.

Phase generator circuit 1100 can be used to implement each of the phase generator circuits 211-218 shown in FIG. 2B. In an embodiment, phase generator circuit 201 has 8 phase generator circuits 1100 that generate 8 output clock signals PH1, PH3, PH5, PH7, PH9, PH11, PH13, and PH15 in response to the 8 input clock signals PH0, PH2, PH4, PH6, PH8, PH10, PH12, and PH14.

Before phase generator 1100 is enabled, signals PCNT[4:0] are all in logic low states, inverters 308 cause all of the signals PCNTB[4:0] to be in logic high states, and delay circuits 301-304 are set to generate the minimum delays in their output clock signals.

The S clock signal is transmitted to the D input of flip-flop 1102. Inverter circuit 1105 inverts the S clock signal to generate a complementary SB clock signal that is transmitted to the D input of flip-flop 1101. PH2 is transmitted to the clock inputs of flip-flops 1101-1102. AND gate 1111 and flip-flops 1101-1102 function as a phase comparator circuit that compares the phases of clock signals PH2 and S.

If the S clock signal is in a logic high state during a rising edge of PH2, flip-flop 1102 stores a logic high state at its Q output. The Q output of flip-flop 1102 is coupled to the D input of flip-flop 321. If the SB clock signal is in a logic low state during a rising edge of PH2, flip-flop 1101 stores a logic high state at its QB output, and logic AND gate 1111 generates a rising edge in signal A1. Flip-flop 321 drives PCNT0 to a logic high state on the rising edge in A1.

If clock signal S is in a logic high state and clock signal SB is in a logic low state on subsequent rising edges of PH2, logic high states are shifted through flip-flops 322-324 in signals PCNT[3:1] on subsequent rising edges in signal A1. Each additional logic high state in signals PCNT[4:0] increases the delay of each of delay circuits 301-304 by a delay increment.

Clock signal PH2 is transmitted to the clock input of flip-flop 1103. The F clock signal generated by delay circuit 305 is transmitted to the D input of flip-flop 1103.

If clock signal F is in a logic high state on a rising edge of PH2, then flip-flop 1103 drives the PCNT4 signal at its Q output to a logic high state, causing the delays of delay circuits 301-304 to increase. If clock signal F is in a logic low state on a rising edge of PH2, then flip-flop 1103 drives the PCNT4 signal at its Q output to a logic low state, causing the delays of delay circuits 301-304 to decrease.

Figure 12:
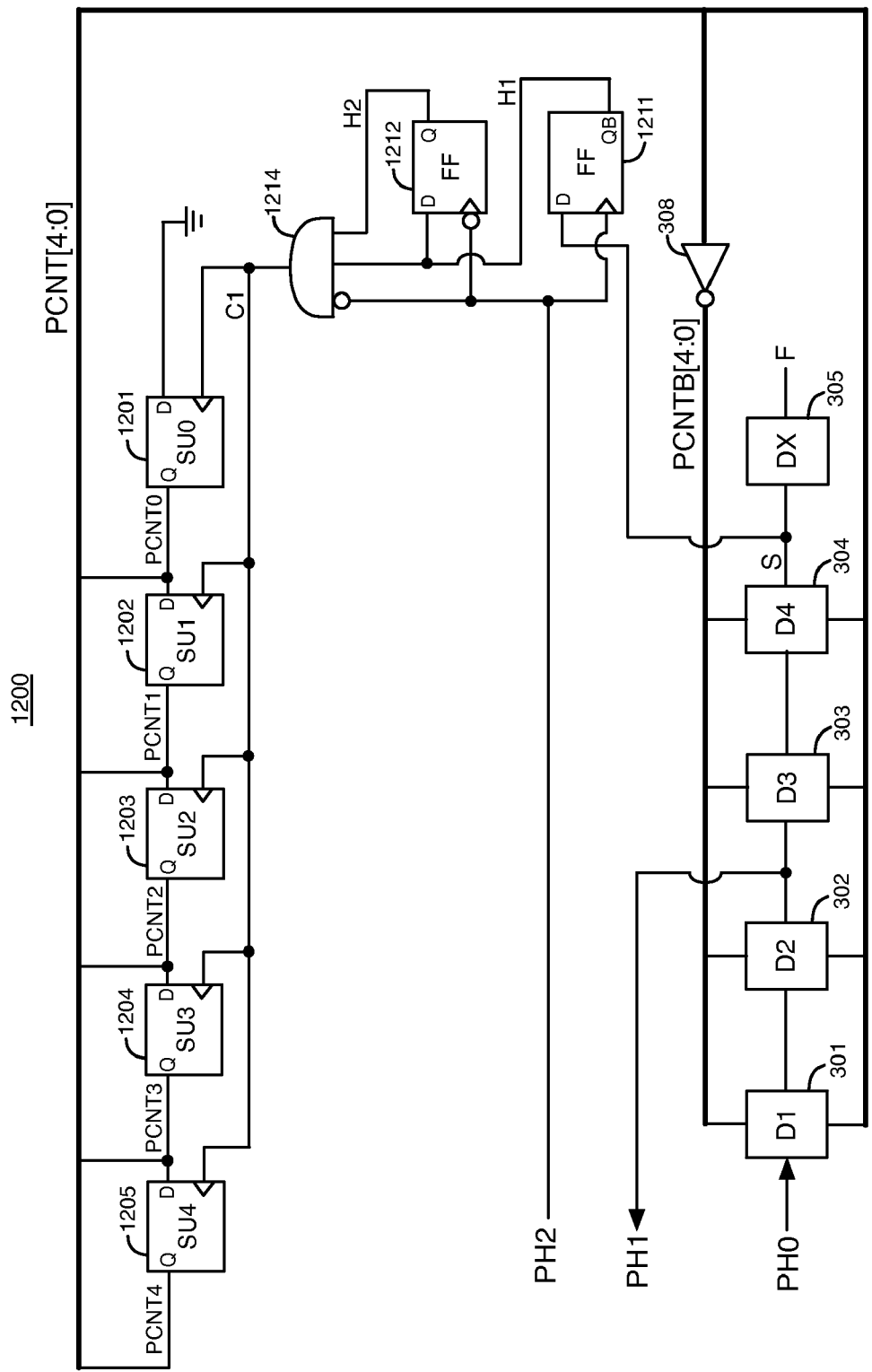
FIG. 12 illustrates another example of a phase generator circuit, according to an embodiment of the present invention.

FIG. 12 illustrates another example of a phase generator circuit 1200, according to an embodiment of the present invention. Phase generator circuit 1200 can be used to implement each of the phase generator circuits 211-218 shown in FIG. 2B. In an embodiment, phase generator circuit 201 has 8 phase generator circuits 1200 that generate 8 output clock signals PH1, PH3, PH5, PH7, PH9, PH11, PH13, and PH15 in response to the 8 input clock signals PH0, PH2, PH4, PH6, PH8, PH10, PH12, and PH14.

Phase generator circuit 1200 includes delay circuits 301-305, CMOS inverter circuits 308, AND gate 1214, D flip-flops 1211-1212, and D flip-flops 1201-1205. Before phase generator 1200 is enabled, signals PCNT[4:0] are all pre-charged to logic high states, inverters 308 drive all of the signals PCNTB[4:0] to logic low states, and delay circuits 301-304 are set to generate the maximum delays in their output clock signals. Phase generator circuit 1200 can decrease the delays of adjustable delay circuits 301-304 to align the phases of clock signals S and PH2.

The temperature of a circuit usually increases during the operation of the circuit. When the temperature of circuit 1200 increases, the delays of delay circuits 301-304 increase. Phase generator circuit 1200 can decrease the delays of delay circuits 301-304 to compensate for the effects of an increase in the temperature of circuit 1200.

If the S clock signal is in a logic low state during a rising edge of the PH2 clock signal, flip-flop 1211 stores a logic high state in the H1 signal at its QB output. On the next falling edge of PH2, flip-flop 1212 stores a logic high state in the H2 signal at its Q output. AND gate 1214 then generates a rising edge in its output signal C1, because the H1 signal, the H2 signal, and the inverted PH2 signal are concurrently in logic high states. The output signal C1 of AND gate 1214 is transmitted to the clock inputs of flip-flops 1201-1205. The D input of flip-flop 1201 is coupled to receive a ground voltage (i.e., at a logic low state).

Flip-flops 1201-1205 are coupled together in series to form a serial shift register. Flip-flop 1201 stores a logic low state at its Q output in signal PCNT0 on a first rising edge of C1. If AND gate 1214 generates a second rising edge in C1, flip-flop 1202 stores a logic low state at its Q output in signal PCNT1. Subsequent rising edges in C1 cause flip-flops 1203-1205 to serially shift logic low states into signals PCNT2, PCNT3, and PCNT4, respectively.

Each additional rising edge in the C1 signal causes flip-flops 1201-1205 to generate an additional 0 (i.e., logic low state) in the PCNT[4:0] signals. Each additional 0 in the PCNT[4:0] signals causes the delay of each of the delay circuits 301-304 to decrease by a delay increment, causing the phase of clock signal S to occur earlier in time. Phase generator circuit 1200 continues to generate additional logic low states in the PCNT[4:0] signals until clock signal S is in a logic high state during the rising edges of clock signal PH2, causing clock signal S to be phase aligned or approximately phase aligned with clock signal PH2.

Phase generator circuit 1200 may generate 0, 1, 2, 3, 4, or 5 rising edges in signal C1 in order to align the phases of clock signals S and PH2. When clock signal S is high on the rising edges of PH2, AND gate 1214 and flip-flops 1211-1212 cause signal C1 to remain in a logic low state, and the logic states of control signals PCNT[4:0] and PCNTB[4:0] remain constant. When clock signals S and PH2 are aligned in phase or nearly aligned in phase, the phase of output clock signal PH1 is approximately halfway between the phases of PH0 and PH2. For example, if the phases of clock signals PH0 and PH2 are 0° and 45°, respectively, phase generator circuit 1200 drives the phase of clock signal PH1 to 22.5°. Flip-flops 1201-1205 can only decrease the delays of delay circuits 301-304 in circuit 1200. AND gate 1214 and flip-flops 1211-1212 function as a phase comparator circuit that compares phases of clock signals PH2 and S to generate a phase comparison signal C1.

Figure 13:
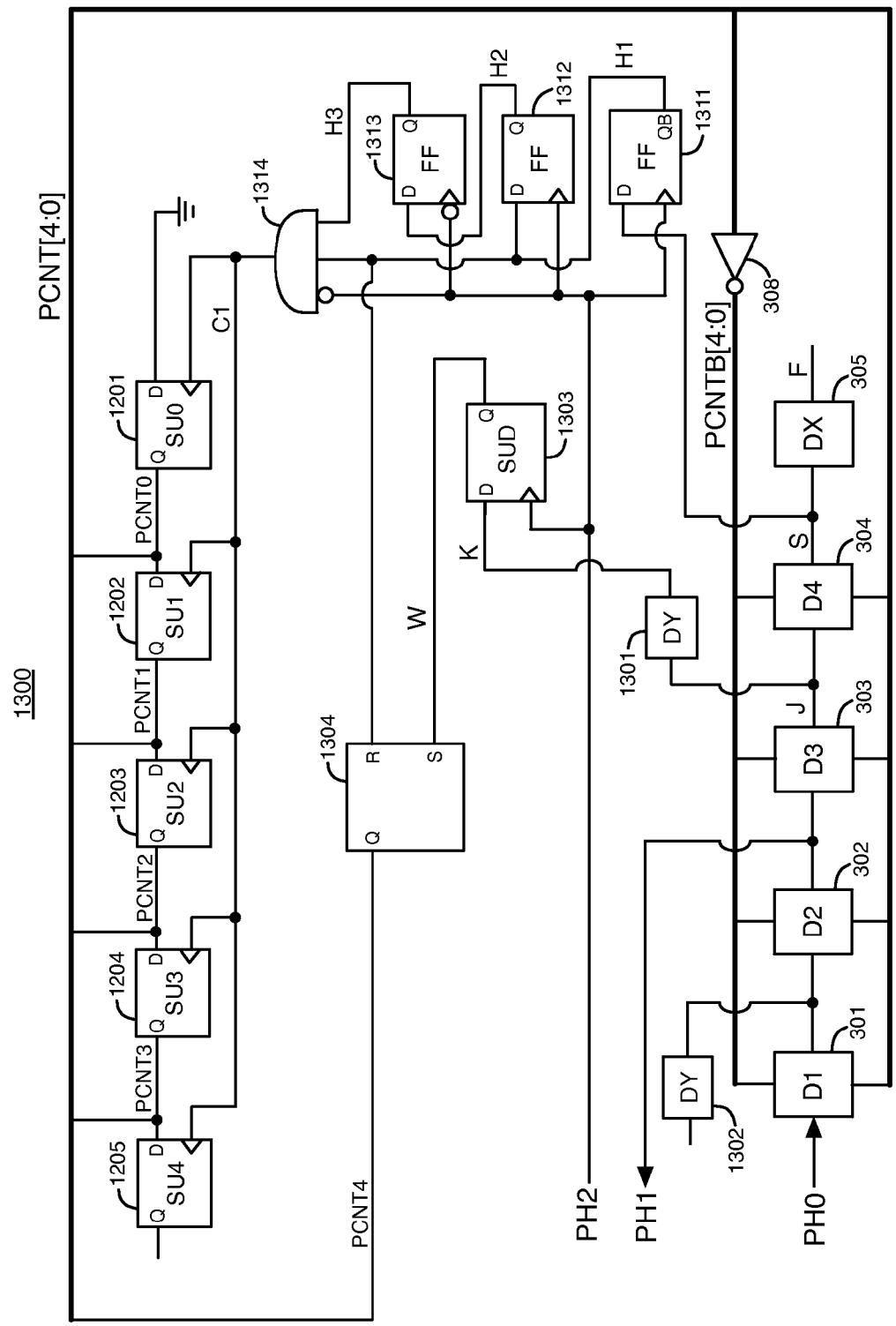
FIG. 13 illustrates another example of a phase generator circuit, according to an embodiment of the present invention.

FIG. 13 illustrates another example of a phase generator circuit 1300 according to an embodiment of the present invention. Phase generator circuit 1300 can be used to implement each of the phase generator circuits 211-218 shown in FIG. 2B. In an embodiment, phase generator circuit 201 has 8 phase generator circuits 1300 that generate 8 output clock signals PH1, PH3, PH5, PH7, PH9, PH11, PH13, and PH15 in response to the 8 input clock signals PH0, PH2, PH4, PH6, PH8, PH10, PH12, and PH14.

Phase generator circuit 1300 can increase or decrease the phase of its generated output clock signal PH1. Phase generator circuit 1300 includes delay circuits 301-305, CMOS inverter circuits 308, D flip-flops 1311-1313, D flip-flop 1303, AND logic gate 1314, D flip-flops 1201-1205, SR flip-flop 1304, and delay circuits 1301-1302. SR flip-flop 1304 generates the PCNT4 signal at its Q output. The Q output of flip-flop 1205 does not control the delays of circuits 301-304 in circuit 1300.

Initially, signals PCNT[4:0] are all pre-charged to logic high states, inverters 308 drive signals PCNTB[4:0] to logic low states, and delay circuits 301-304 are set to their maximum delays. When the S clock signal is in a logic low state on a rising edge of the PH2 clock signal, flip-flop 1311 stores a logic high state at its QB output in signal H1. The logic high state of signal H1 resets flip-flop 1304, causing the PCNT4 signal to transition to a logic low state. After PCNT4 transitions low, the delay of each of the delay circuits 301-304 decreases by a delay increment.

On the next rising edge of the PH2 clock signal, flip-flop 1312 stores a logic high state at its Q output in signal H2, and output signal H1 of flip-flop 1311 remains in a logic high state if clock signal S is in a logic low state on that rising edge of PH2. On the next falling edge of PH2, flip-flop 1313 stores the logic high state of H2 at its Q output in signal H3. AND gate 1314 then generates a rising edge in signal C1 in response to all three of the H1, H3, and inverted PH2 signals concurrently being in logic high states. AND gate 1314 and flip-flops 1311-1313 function as a phase comparator circuit that compares the phases of clock signals PH2 and S to generate phase comparison signals C1 and H1. Flip-flop 1303 also functions as a phase comparator.

Each rising edge in the C1 signal causes flip-flops 1201-1204 to generate an additional 0 (i.e., logic low state) in the PCNT[3:0] signals. Each additional 0 in the PCNT[3:0] signals causes the delay of each of delay circuits 301-304 to decrease by a delay increment, causing the phase of clock signal S to occur earlier in time. Phase generator circuit 1300 continues to generate rising and falling edges in signal C1 until clock signal S is in a logic high state on the rising edges of clock signal PH2. Phase generator circuit 1300 generates enough rising edges in C1 to cause clock signal S to be phase aligned or approximately phase aligned with clock signal PH2.

When the S clock signal is in a logic high state on the rising edge of the PH2 clock signal, flip-flop 1311 stores a logic low state at its QB output in signal H1. On the next rising edge of PH2, flip-flop 1312 stores a logic low state in signal H2 at its Q output. On the next falling edge of the PH2 clock signal, flip-flop 1313 stores a logic low state at its Q output in signal H3. The output signal C1 of AND gate 1314 is in a logic low state after signal H1 transitions low.

Phase generator circuit 1300 may generate 0, 1, 2, 3, or 4 rising edges in signal C1 in order to align the phases of clock signals S and PH2. If clock signal S is high on the rising edges of PH2, signal C1 remains in a logic low state, and the logic states of control signals PCNT[3:0] and PCNTB[3:0] remain constant. When clock signals S and PH2 are aligned in phase or nearly aligned in phase, the phase of output clock signal PH1 occurs approximately halfway between the phases of PH0 and PH2.

During the operation of phase generator circuit 1300, a change in the temperature of circuit 1300 may cause the phase of clock signal PH1 to shift such that the phase of PH1 is no longer halfway between the phases of PH0 and PH2. Flip-flops 1201-1204 can only decrease the delays of delay circuits 301-304 in circuit 1300. After a logic low state is stored at the Q output of any of flip-flops 1201-1205, the Q output of that flip-flop remains in a logic low state during circuit operation. After signals PCNT[3:0] are all in logic low states in circuit 1300, signals PCNT[3:0] remain in logic low states during the operation of circuit 1300.

SR flip-flop 1304 can cause the delays of delay circuits 301-304 to increase or decrease by changing the logic state of signal PCNT4. Flip-flop 1304 can be set to cause signal PCNT4 to transition to a logic high state to increase the delays of delay circuits 301-304, for example, after a decrease in the temperature of circuit 1300.

Delay circuits 301-303 delay clock signal PH0 to generate a delayed clock signal J at the output of delay circuit 303. Delay circuit 1301 delays clock signal J to generate a delayed clock signal K. The delay that delay circuit 1301 provides to K relative to J is less than the delay that delay circuit 304 provides to S relative to J. For example, the delay of delay circuit 1301 can be 80% of the delay of delay circuit 304. Delay circuit 1302 is coupled to the output of delay circuit 301 to provide a load at the output of delay circuit 301 that matches the load caused by delay circuit 1301 at the output of delay circuit 303.

Clock signal K is transmitted to the D input of flip-flop 1303. The PH2 clock signal is transmitted to the clock input of flip-flop 1303. Flip-flop 1303 stores the logic state of clock signal K at its Q output in signal W at each rising edge of clock signal PH2. If signal K is in a logic high state on a rising edge in PH2, flip-flop 1303 sets flip-flop 1304, causing the PCNT4 signal to transition to a logic high state. After signal PCNT4 transitions high, the delay of each of delay circuits 301-304 increases by a delay increment to more closely align the phases of PH2 and S.

Figure 14:
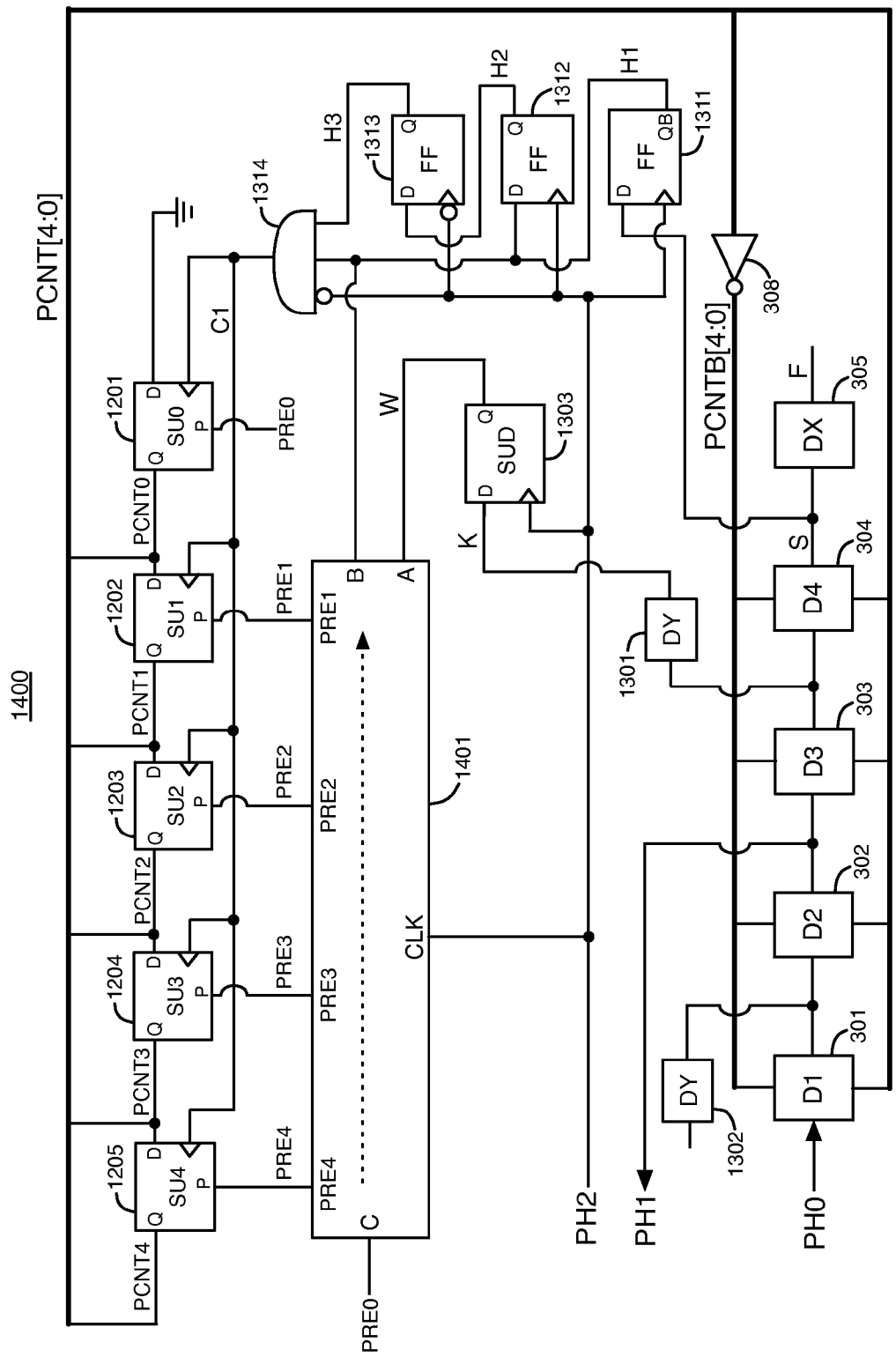
FIG. 14 illustrates another example of a phase generator circuit, according to an embodiment of the present invention.

FIG. 14 illustrates another example of a phase generator circuit 1400, according to an embodiment of the present invention. Phase generator circuit 1400 can be used to implement each of the phase generator circuits 211-218 shown in FIG. 2B. In an embodiment, phase generator circuit 201 has 8 phase generator circuits 1400 that generate 8 output clock signals PH1, PH3, PH5, PH7, PH9, PH11, PH13, and PH15 in response to the 8 input clock signals PH0, PH2, PH4, PH6, PH8, PH10, PH12, and PH14.

Phase generator circuit 1400 can increase or decrease the phase of its generated output clock signal PH1. Phase generator circuit 1400 includes delay circuits 301-305, CMOS inverter circuits 308, D flip-flops 1311-1313, D flip-flop 1303, AND logic gate 1314, D flip-flops 1201-1205, delay circuits 1301-1302, and pre-charge logic circuit 1401. In circuit 1400, the PCNT4 signal is generated at the Q output of flip-flop 1205. The PCNT[4:0] signals control the delays of adjustable delay circuits 301-304.

The H1 signal at the QB output of flip-flop 1311 is transmitted to the B input of logic circuit 1401. The W signal at the Q output of flip-flop 1303 is transmitted to the A input of logic circuit 1401. A pre-charge input signal PRE0 is transmitted to the C input of logic circuit 1401 and to the pre-charge P input of flip-flop 1201. The PH2 signal is transmitted to the clock CLK input of circuit 1401. Logic circuit 1401 can be, for example, a state machine.

Before phase generator 1400 is enabled, a logic high pulse is generated in the PRE0 input signal. The logic high pulse in PRE0 causes flip-flop 1201 to pre-charge the PCNT0 signal to a logic high state. The logic high pulse in PRE0 also causes logic circuit 1401 to generate logic high pulses in the PRE1-PRE4 signals at its PRE1-PRE4 outputs, causing flip-flops 1202-1205, respectively, to pre-charge the PCNT[4:1] signals to logic high states. Inverters 308 drive signals PCNTB[4:0] to logic low states, and delay circuits 301-304 are set to their maximum delays.

Each time that clock signal S is in a logic low state on two consecutive rising edges of PH2, AND gate 1314 subsequently generates a rising edge in signal C1, as described above with respect to phase generator circuit 1300. Phase generator circuit 1400 aligns the phases of clock signals S and PH2 by shifting a logic low signal from the ground voltage through one or more of flip-flops 1201-1205 in response to each rising edge of signal C1, as described above with respect to phase generator circuit 1200. Each additional flip-flop 1201-1205 that stores a logic low state at its Q output causes the delay of each of delay circuits 301-304 to decrease by one delay increment.

During the operation of phase generator circuit 1400, a change in the temperature of circuit 1400 may cause the phase of clock signal PH1 to shift such that the phase of PH1 is no longer halfway between the phases of PH0 and PH2. For example, if the temperature of circuit 1400 decreases, the delays of delay circuits 301-304 may decrease enough to cause flip-flops 1303 and 1311 to generate logic low states in signals W and H1 on a rising edge of PH2. Logic circuit 1401 generates a sequence of logic high pulses in the pre-charge signals PRE1-PRE4 to pre-charge the PCNT[4:1] signals to logic high states in response to signals W and H1 concurrently being in logic low states for multiple periods of PH2.

In response to signals W and H1 concurrently being in logic low states in a first period of PH2, logic circuit 1401 initially generates a logic high pulse in pre-charge signal PRE4. Flip-flop 1205 pre-charges the PCNT4 signal to a logic high state on a rising edge of PRE4. If both of signals W and H1 remain low in a second period of PH2, logic circuit 1401 generates a logic high pulse in pre-charge signal PRE3. Flip-flop 1204 pre-charges the PCNT3 signal to a logic high state on a rising edge of PRE3.

If signals W and H1 remain low in a third period of PH2, logic circuit 1401 generates a logic high pulse in pre-charge signal PRE2. Flip-flop 1203 pre-charges the PCNT2 signal to a logic high state on a rising edge of PRE2. If signals W and H1 remain low in a fourth period of PH2, logic circuit 1401 generates a logic high pulse in pre-charge signal PRE1. Flip-flop 1202 pre-charges the PCNT1 signal to a logic high state on a rising edge of PRE1. Each additional logic high signal in the PCNT[4:0] signals increases the delays of delay circuits 301-304 to bring the phases of clock signals S and PH2 closer to alignment.

Figure 15:
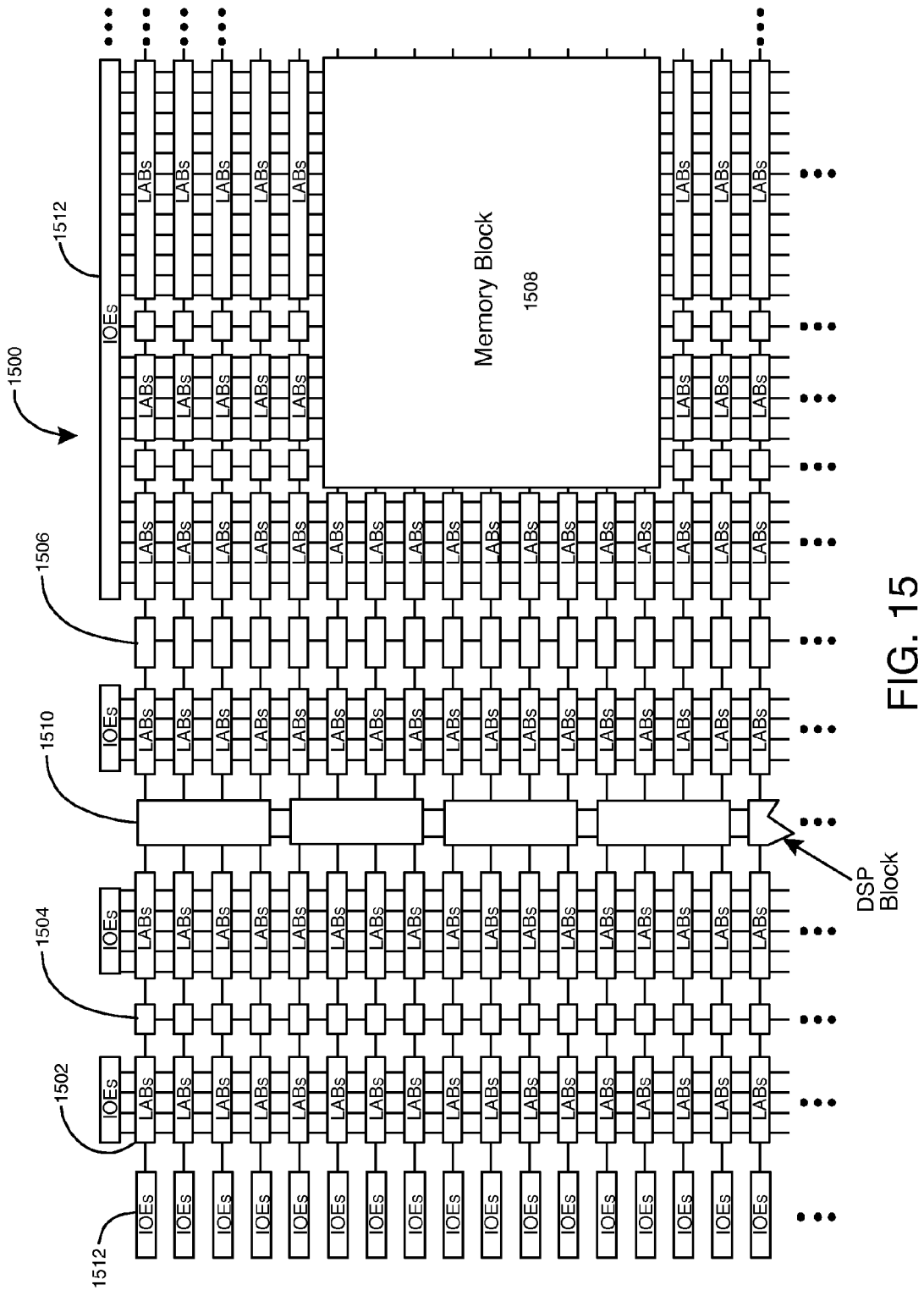
FIG. 15 is a simplified partial block diagram of a field programmable gate array (FPGA) that can include aspects of the present invention.

FIG. 15 is a simplified partial block diagram of a field programmable gate array (FPGA) 1500 that can include aspects of the present invention. FPGA 1500 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 1500 includes a two-dimensional array of programmable logic array blocks (or LABs) 1502 that are interconnected by a network of column and row interconnect conductors of varying length and speed. LABs 1502 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 1500 also includes a distributed memory structure including random access memory (RAM) blocks of varying sizes provided throughout the array. The RAM blocks include, for example, blocks 1504, blocks 1506, and block 1508. These memory blocks can also include shift registers and first-in-first-out (FIFO) buffers.

FPGA 1500 further includes digital signal processing (DSP) blocks 1510 that can implement, for example, multipliers with add or subtract features. Input/output elements (IOEs) 1512 located, in this example, around the periphery of the chip, support numerous single-ended and differential input/output standards. IOEs 1512 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 1500 is described herein for illustrative purposes only and that the present invention can be implemented in many different types of integrated circuits.

Figure 16:
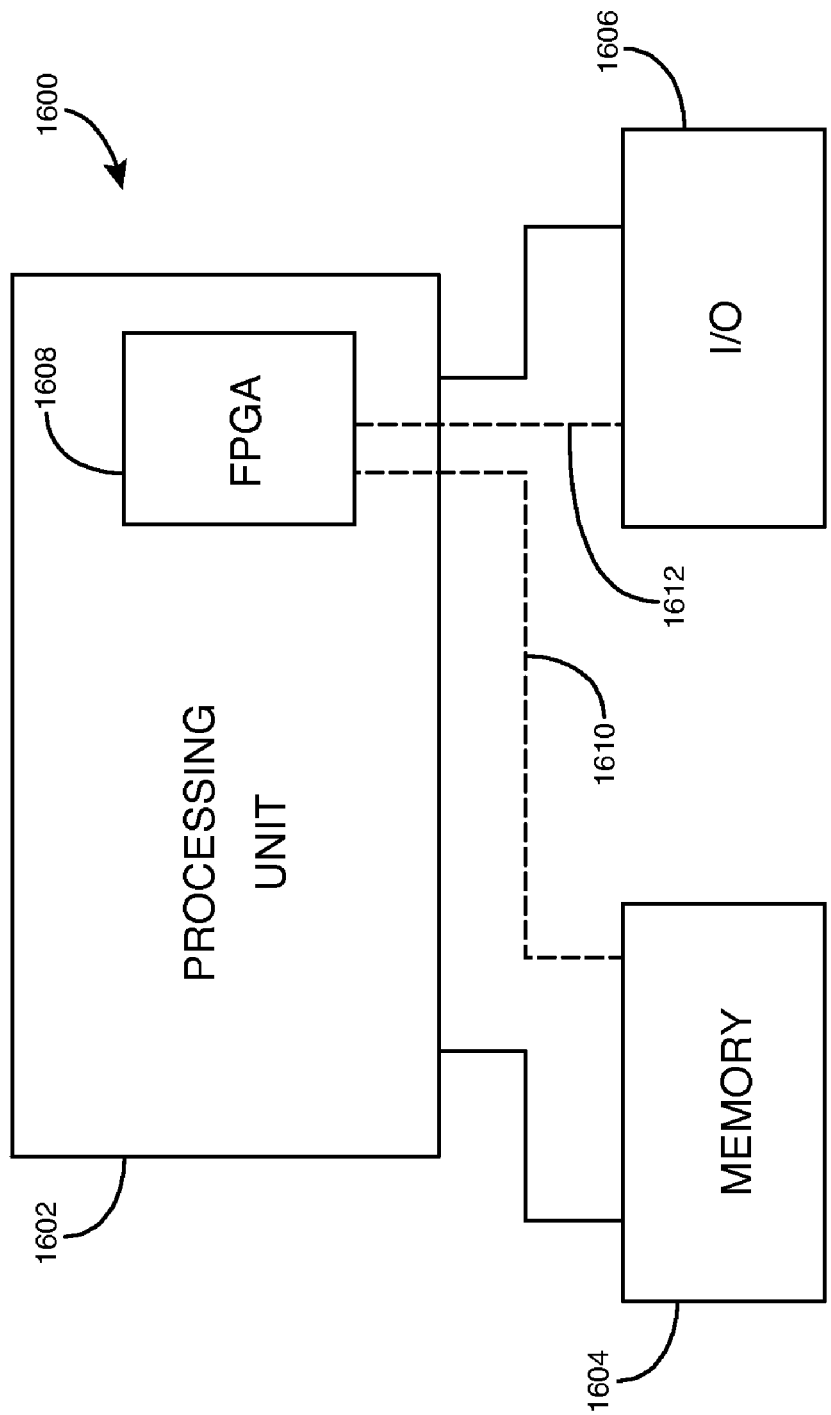
FIG. 16 shows a block diagram of an exemplary digital system that can embody techniques of the present invention.

The present invention can also be implemented in a system that has an FPGA as one of several components. FIG. 16 shows a block diagram of an exemplary digital system 1600 that can embody techniques of the present invention. System 1600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1600 can be provided on a single board, on multiple boards, or within multiple enclosures.

System 1600 includes a processing unit 1602, a memory unit 1604, and an input/output (I/O) unit 1606 interconnected together by one or more buses. According to this exemplary embodiment, an FPGA 1608 is embedded in processing unit 1602. FPGA 1608 can serve many different purposes within the system of FIG. 16. FPGA 1608 can, for example, be a logical building block of processing unit 1602, supporting its internal and external operations. FPGA 1608 is programmed to implement the logical functions necessary to carry on its particular role in system operation. FPGA 1608 can be specially coupled to memory 1604 through connection 1610 and to I/O unit 1606 through connection 1612.

Processing unit 1602 can direct data to an appropriate system component for processing or storage, execute a program stored in memory 1604, receive and transmit data via I/O unit 1606, or other similar functions. Processing unit 1602 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1608 can control the logical operations of the system. As another example, FPGA 1608 acts as a reconfigurable processor that can be reprogrammed as needed to handle a particular computing task. Alternatively, FPGA 1608 can itself include an embedded microprocessor. Memory unit 1604 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A dynamic phase alignment circuit comprising:
   a phase generator circuit comprising delay-locked loop circuits operable to generate periodic output signals, wherein each of the delay-locked loop circuits is operable to generate one of the periodic output signals in response to at least two periodic input signals;
   a multiplexer circuit operable to provide a selected periodic signal from among the periodic input signals and the periodic output signals based on select signals;
   a phase detection circuit operable to compare a phase of the selected periodic signal to a data signal to generate a phase detection signal; and
   a first control logic circuit operable to generate the select signals, wherein the first control logic circuit is operable to adjust the select signals based on changes in the phase detection signal to cause the multiplexer circuit to adjust the phase of the selected periodic signal,
   wherein each of the delay-locked loop circuits comprises a shift register operable to cause a delay provided to a first delayed signal to vary based on a phase comparison between the first delayed signal and a first one of the periodic input signals, and wherein a second one of the periodic input signals is delayed to generate the first delayed signal.

2. The dynamic phase alignment circuit of claim 1 wherein each of the delay-locked loop circuits further comprises:
   a phase comparator circuit operable to generate a phase comparison signal based on the first one of the periodic input signals and the first delayed signal,
   wherein the shift register is operable to generate delay control signals, and wherein the shift register is clocked by the phase comparison signal; and
   a delay chain comprising adjustable delay circuits, wherein the delay control signals control delays of the adjustable delay circuits, and wherein the delay chain is operable to generate the first delayed signal.

3. The dynamic phase alignment circuit of claim 2 wherein the phase comparator circuit in each of the delay-locked loop circuits comprises:
   a first flip-flop comprising a first input operable to receive the first one of the periodic input signals and a second input operable to receive the first delayed signal;
   a second flip-flop comprising a first input operable to receive the first one of the periodic input signals and a second input operable to receive an output signal of the first flip-flop; and
   a first logic gate circuit comprising a first input operable to receive the output signal of the first flip-flop and a second input operable to receive the first one of the periodic input signals.

4. The dynamic phase alignment circuit of claim 3 wherein the phase comparator circuit in each of the delay-locked loop circuits further comprises:
   a third flip-flop comprising a first input operable to receive the first one of the periodic input signals and a second input operable to receive an output signal of the second flip-flop, and wherein the first logic gate circuit comprises a third input operable to receive an output signal of the third flip-flop.

5. The dynamic phase alignment circuit of claim 4 wherein each of the delay-locked loop circuits further comprises:
   a fourth flip-flop comprising a first input operable to receive a second delayed signal generated by the delay chain and a second input operable to receive the first one of the periodic input signals, wherein the delay chain is operable to receive the second one of the periodic input signals; and
   a fifth flip-flop comprising a first input operable to receive an output signal of the fourth flip-flop and a second input operable to receive the output signal of the first flip-flop, wherein the fifth flip-flop is operable to store a signal that controls the delays of the adjustable delay circuits.

6. The dynamic phase alignment circuit of claim 5 wherein each of the delay-locked loop circuits further comprises a second logic gate circuit comprising a first input operable to receive the signal stored by the fifth flip-flop and a second input operable to receive an input signal, and wherein the second logic gate circuit is operable to cause the shift register to drive one of the delay control signals to a predefined logic state in response to a change in an output signal of the second logic gate circuit.

7. The dynamic phase alignment circuit of claim 4 wherein each of the delay-locked loop circuits further comprises:
   a fourth flip-flop comprising a first input operable to receive a second delayed signal generated by the delay chain and a second input operable to receive the first one of the periodic input signals; and
   a second control logic circuit operable to cause the shift register to drive at least a subset of the delay control signals to predefined logic states in response to an output signal of the fourth flip-flop and the output signal of the first flip-flop.

8. The dynamic phase alignment circuit of claim 2 wherein each of the adjustable delay circuits in the delay chain comprises a first pass gate coupled between a first capacitor and an output node of the adjustable delay circuit and a second pass gate coupled between a second capacitor and the output node of the adjustable delay circuit.

9. The dynamic phase alignment circuit of claim 1 wherein the dynamic phase alignment circuit is in a field programmable gate array integrated circuit, and wherein the phase detection circuit comprises phase detector circuits and counter circuits.

10. The dynamic phase alignment circuit of claim 1 wherein the phase generator circuit comprises at least 8 delay-locked loop circuits that generate 8 periodic output signals.

11. A circuit comprising:
    a phase comparator circuit operable to generate a phase comparison signal in response to a first delayed signal and a first periodic input signal;
    a shift register comprising storage circuits operable to generate delay control signals, wherein the storage circuits are operable to update the delay control signals in response to the phase comparison signal; and
    a delay chain comprising adjustable delay circuits, wherein delays of the adjustable delay circuits are operable to vary based on changes in the delay control signals, and wherein the delay chain is operable to delay a second periodic input signal to generate the first delayed signal,
    wherein each of the adjustable delay circuits in the delay chain comprises a first pass gate coupled between a first capacitor and an output node of the adjustable delay circuit and a second pass gate coupled between a second capacitor and the output node of the adjustable delay circuit, and wherein the first and the second pass gates are controlled by the delay control signals.

12. The circuit of claim 11 wherein a high supply voltage is transmitted to an input of a first one of the storage circuits, and wherein logic high signals are shifted through the storage circuits in response to edges of the phase comparison signal.

13. The circuit of claim 11 wherein a ground voltage is transmitted to an input of a first one of the storage circuits, and wherein logic low signals are shifted through the storage circuits in response to edges of the phase comparison signal.

14. The circuit of claim 11 wherein the phase comparator circuit comprises:
    a first flip-flop comprising a first input operable to receive the first periodic input signal and a second input operable to receive the first delayed signal; and
    a second flip-flop comprising a first input operable to receive the first periodic input signal and a second input operable to receive an output signal of the first flip-flop.

15. The circuit of claim 11 wherein each of the adjustable delay circuits in the delay chain comprises a third capacitor coupled to the first capacitor and a fourth capacitor coupled to the second capacitor.

16. A circuit comprising:
    a phase comparator circuit operable to generate a phase comparison signal in response to a first delayed signal and a first periodic input signal;
    a shift register comprising storage circuits operable to generate delay control signals, wherein the storage circuits are operable to update the delay control signals in response to the phase comparison signal; and
a delay chain comprising adjustable delay circuits, wherein delays of the adjustable delay circuits are operable to vary based on changes in the delay control signals, and wherein the delay chain is operable to delay a second periodic input signal to generate the first delayed signal,
wherein the phase comparator circuit comprises:
a first flip-flop comprising a first input operable to receive the first periodic input signal and a second input operable to receive the first delayed signal;
a second flip-flop comprising a first input operable to receive the first periodic input signal and a second input operable to receive an output signal of the first flip-flop;
a third flip-flop comprising a first input operable to receive the first periodic input signal and a second input operable to receive an output signal of the second flip-flop; and
a first logic gate circuit comprising a first input operable to receive the output signal of the first flip-flop, a second input operable to receive the first periodic input signal, and a third input operable to receive an output signal of the third flip-flop.

17. The circuit of claim 16 further comprising:
a fourth flip-flop comprising a first input operable to receive a second delayed signal generated by the delay chain and a second input operable to receive the first periodic input signal; and
a fifth flip-flop comprising a first input operable to receive an output signal of the fourth flip-flop and a second input operable to receive the output signal of the first flip-flop, wherein the fifth flip-flop stores a signal that controls the delays of the adjustable delay circuits.

18. The circuit of claim 17 further comprising:
a second logic gate circuit comprising a first input operable to receive the signal stored by the fifth flip-flop and a second input operable to receive an input signal, wherein the second logic gate circuit is operable to cause the shift register to drive one of the delay control signals to a predefined logic state in response to a change in an output signal of the second logic gate circuit.

19. The circuit of claim 16 further comprising:
a fourth flip-flop comprising a first input operable to receive a second delayed signal generated by the delay chain and a second input operable to receive the first periodic input signal; and
a control logic circuit operable to cause the shift register to drive at least a subset of the delay control signals to predefined logic states in response to an output signal of the fourth flip-flop and the output signal of the first flip-flop.

20. A circuit comprising:
a phase comparator circuit operable to generate a phase comparison signal in response to a first delayed signal and a first periodic input signal;
a shift register comprising storage circuits operable to generate delay control signals, wherein the storage circuits are operable to update the delay control signals in response to the phase comparison signal; and
a delay chain comprising adjustable delay circuits, wherein delays of the adjustable delay circuits are operable to vary based on changes in the delay control signals, and wherein the delay chain is operable to delay a second periodic input signal to generate the first delayed signal,
wherein the phase comparator circuit comprises:
a first flip-flop comprising a first input operable to receive the first periodic input signal and a second input operable to receive the first delayed signal; and
a second flip-flop comprising a first input operable to receive the first periodic input signal and a second input operable to receive a second delayed signal, wherein the first delayed signal is inverted to generate the second delayed signal,
wherein the shift register comprises a first input that is responsive to an output signal of the first flip-flop and a second input that is responsive to an output signal of the second flip-flop.

21. A method comprising:
generating periodic output signals in response to periodic input signals using delay-locked loops, wherein each of the delay-locked loops generates one of the periodic output signals based on at least two of the periodic input signals, and wherein each of the delay-locked loops comprises a shift register that causes a delay provided to a first delayed signal to vary based on a phase comparison between the first delayed signal and a first one of the periodic input signals, and wherein a second one of the periodic input signals is delayed to generate the first delayed signal;
selecting a selected periodic signal from among the periodic input signals and the periodic output signals based on select signals;
comparing a phase of the selected periodic signal to a data signal to generate a phase detection signal; and
generating the select signals and adjusting the select signals based on changes in the phase detection signal in order to cause an adjustment in the phase of the selected periodic signal.

22. The method of claim 21 wherein generating periodic output signals in response to periodic input signals using delay-locked loops further comprises:
comparing phases of the first delayed signal and the first one of the periodic input signals to generate a phase comparison signal;
generating delay control signals by shifting signals through the shift register, wherein the shift register is driven by the phase comparison signal;
adjusting delays of delay circuits coupled in a delay chain based on the delay control signals; and
generating the first delayed signal in response to the second one of the periodic input signals using the delay chain.

23. The method of claim 22 wherein comparing phases of the first delayed signal and the first one of the periodic input signals to generate a phase comparison signal further comprises:
storing a first stored signal in response to the first delayed signal and the first one of the periodic input signals;
storing a second stored signal in response to the first stored signal and the first one of the periodic input signals; and
generating the phase comparison signal by performing a logic function on the first stored signal and the first one of the periodic input signals.

24. The method of claim 23 wherein comparing phases of the first delayed signal and the first one of the periodic input signals to generate a phase comparison signal further comprises:
storing a third stored signal in response to the second stored signal and the first one of the periodic input signals, and wherein generating the phase comparison signal by performing a logic function on the first stored signal and the first one of the periodic input signals further comprises generating the phase comparison signal by performing the logic function on the first stored signal, the first one of the periodic input signals, and the third stored signal.

25. The method of claim 24 wherein generating periodic output signals in response to periodic input signals using delay-locked loops further comprises:

storing a fourth stored signal in response to the first one of the periodic input signals and a second delayed signal generated by the delay chain; and storing a fifth stored signal in response to the fourth stored signal and the first stored signal, wherein the fifth stored signal controls the delays of the delay circuits.

26. The method of claim 25 wherein generating periodic output signals in response to periodic input signals using delay-locked loops further comprises:

generating a control signal that causes the shift register to drive one of the delay control signals to a predefined logic state by performing a logic function on the fifth stored signal and an input signal.

27. The method of claim 24 wherein generating periodic output signals in response to periodic input signals using delay-locked loops further comprises:

storing a fourth stored signal in response to the first one of the periodic input signals and a second delayed signal generated by the delay chain; and generating register control signals that cause the shift register to drive at least a subset of the delay control signals to predefined logic states in response to the fourth stored signal and the first stored signal.

28. The method of claim 22 wherein generating the first delayed signal in response to the second one of the periodic input signals using the delay chain further comprises inverting the second one of the periodic input signals using first and second transistors, and wherein adjusting delays of delay circuits coupled in a delay chain based on the delay control signals further comprises:

increasing a delay provided to the first delayed signal based on the delay control signals by coupling first and second capacitors to an output node of one of the delay circuits, wherein the first and the second capacitors are coupled between a first node at a high voltage and a second node at a low voltage; and increasing the delay provided to the first delayed signal based on the delay control signals by coupling third and fourth capacitors to the output node, wherein the third and the fourth capacitors are coupled between the first and the second nodes.

29. A method comprising:

comparing phases of a first delayed signal and a first periodic input signal to generate a phase comparison signal;

generating delay control signals by shifting signals through a shift register;

updating the delay control signals based on the phase comparison signal;

adjusting delays of delay circuits coupled in a delay chain based on the delay control signals; and generating the first delayed signal in response to a second periodic input signal using the delay chain, wherein comparing phases of a first delayed signal and a first periodic input signal to generate a phase comparison signal comprises:

storing a first stored signal in response to the first delayed signal and the first periodic input signal;

storing a second stored signal in response to the first stored signal and the first periodic input signal;

storing a third stored signal in response to the second stored signal and the first periodic input signal; and generating the phase comparison signal by performing a logic function on the first stored signal, the first periodic input signal, and the third stored signal.

30. The method of claim 29 further comprising:

storing a fourth stored signal in response to the first periodic input signal and a second delayed signal generated by the delay chain; and storing a fifth stored signal in response to the fourth stored signal and the first stored signal, wherein the fifth stored signal controls the delays of the delay circuits.

31. The method of claim 30 further comprising:

generating a control signal that causes the shift register to drive one of the delay control signals to a predefined logic state by performing a logic function on the fifth stored signal and an input signal.

32. The method of claim 29 further comprising:

storing a fourth stored signal in response to the first periodic input signal and a second delayed signal generated by the delay chain; and generating register control signals that cause the shift register to drive at least a subset of the delay control signals to predefined logic states in response to the fourth stored signal and the first stored signal.

33. The method of claim 29 wherein each of at least a subset of the delay circuits in the delay chain comprises a first pass gate coupled between a first capacitor and an output node of the delay circuit and a second pass gate coupled between a second capacitor and the output node of the delay circuit, and wherein the first and the second pass gates are controlled by the delay control signals.

* * * * *